United States Patent
Brzezowski et al.

(10) Patent No.: US 8,103,465 B2
(45) Date of Patent: Jan. 24, 2012

(54) SYSTEM AND METHOD FOR MONITORING AND MANAGING ENERGY PERFORMANCE

(75) Inventors: Edward H. Brzezowski, Chester, NJ (US); Joseph G. Grabowski, Red Bank, NJ (US)

(73) Assignee: Noveda Technologies, Inc., Branchburg, NJ (US)

( * ) Notice: Subject to any disclaimer, the term of this patent is extended or adjusted under 35 U.S.C. 154(b) by 900 days.

(21) Appl. No.: 12/082,089

(22) Filed: Apr. 7, 2008
(Under 37 CFR 1.47)

(65) Prior Publication Data
US 2009/0088991 A1 Apr. 2, 2009

Related U.S. Application Data

(60) Provisional application No. 60/922,637, filed on Apr. 9, 2007.

(51) Int. Cl.
*G01R 21/00* (2006.01)
(52) U.S. Cl. ............... 702/62; 702/30; 702/61; 702/182; 702/183; 702/184; 702/185; 702/186; 700/286; 700/291; 705/412
(58) Field of Classification Search ............... 702/60–62, 702/182–186, 188; 700/286, 291; 705/412
See application file for complete search history.

(56) References Cited

U.S. PATENT DOCUMENTS

| | | | |
|---|---|---|---|
| 6,671,585 B2 * | 12/2003 | Lof et al. | 705/36 R |
| 6,785,592 B1 * | 8/2004 | Smith et al. | 700/291 |
| 2005/0143865 A1 * | 6/2005 | Gardner | 700/291 |
| 2006/0184445 A1 | 8/2006 | Sandor et al. | |

OTHER PUBLICATIONS

Ambike. 'Closed-loop real-time control on distributed networks'. Masters Thesis, Texas A&M 1-30 University [online]. Published Aug. 2004. [retrieved on Jul. 15, 2008]. Retrieved from the Internet: CURL: http://txspace.tamu.edu/bitstream/handle/1969.I/1079/etd-tamu-20048-MEEN-Ambike~2.pdf?sequence1.
International Search Report, PCT/US2008/04643.

* cited by examiner

*Primary Examiner* — Sujoy Kundu
(74) *Attorney, Agent, or Firm* — Lerner, David, Littenberg, Krumholz & Mentlik, LLP

(57) ABSTRACT

Generation of renewable energy for, exportation of the renewable energy from, importation of utility generated energy to, and consumption of energy at, a facility are monitored in substantially real time to provide for substantially real time management and reporting of energy performance of the facility. Monitoring of environmental conditions and facility operations of the facility, also in substantially real time and time correlated with the energy monitoring, is performed to further enhance the management and reporting of the energy performance of the facility.

19 Claims, 20 Drawing Sheets

Kilowatt Hours
Electricity consumed from the grid this month:

- 4,000.0
- 3,333.3 — 3,055.3
- 2,666.7
- 2,000.0
- 1,333.3 — 746.6
- 666.7 — 460.2
- 0

Pre-Engineered Base   Hi performance Solar   Actual Building

| 3055.3 kWH | 744.6 kWH | 460.2 kWH |
|---|---|---|
| Typical pre-engineered base simulation model | High Performance Solar simulation model | Actual consumption |
| $366.64 | $89.35 | $55.22 |
| based on $0.12 kWH | based on $0.12 kWH | based on $0.12 kWH |

Savings estimated this month. (Simulation models versus Actual building)

| $311.41 | $34.13 |
|---|---|
| compared to a typical pre-engineered base building | compared to High Performance Solar simulation model |

Energy Modeling

A building can be mathematically 'modeled' to evaluate the design's energy efficiency and projected energy requirements. This is called *energy modeling*. We gauge the performance of 31 Tannery against two energy models.

The *'typical pre-engineered model'* is that of a building constructed using standard techniques and outfitted with conventional energy systems.

The *'high performance design model'* utilizes state of the art 'renewable' and 'energy conservation' systems and methods.

The real-time display to the left shows the electrical energy use of these two models compared to the actual building.

the bottom line

If 31 Tannery was a typical new construction building, we would have expected to spend $366.64 in electricity so far this month.

The 'high performance model' projected our cost to be closer to $89.35.

In reality, it looks like we've spent an estimated $55.22 this far into the month.

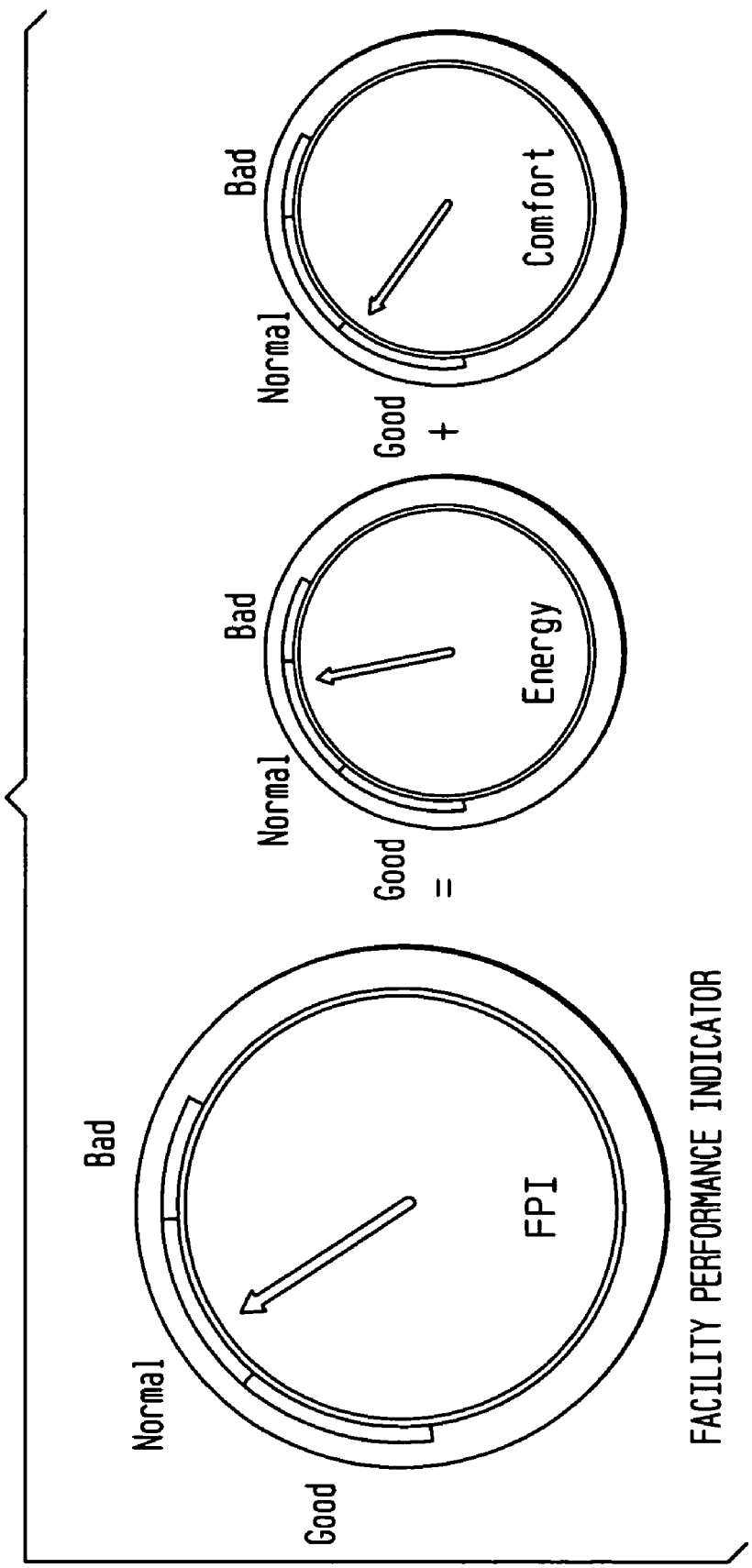

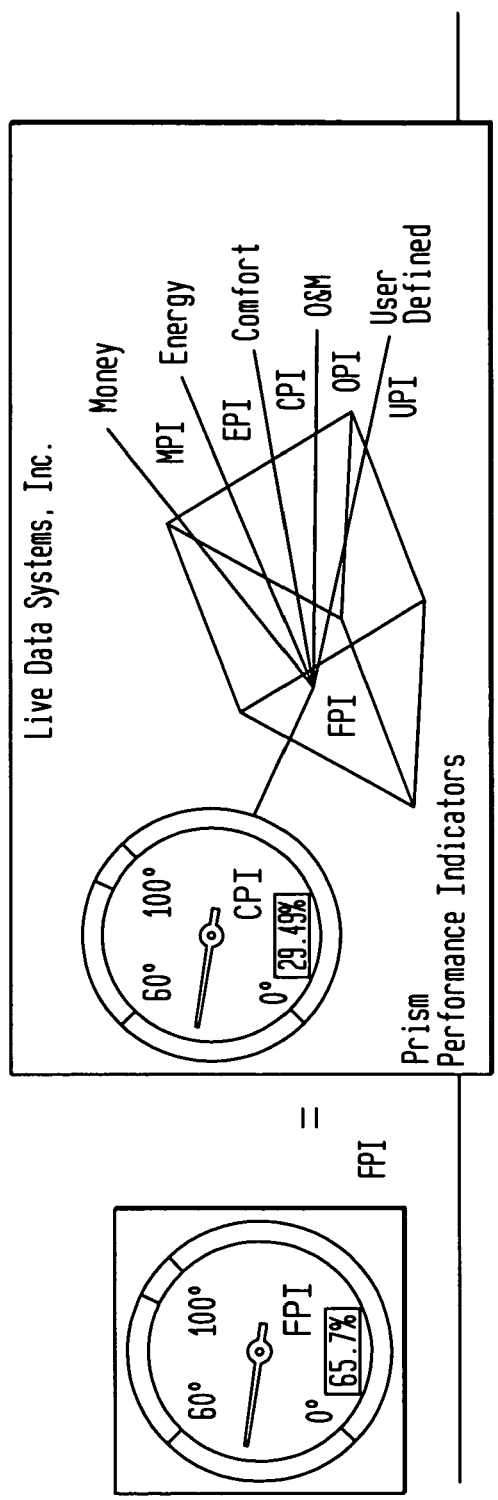
FIG. 9C1

FIG. 9C2
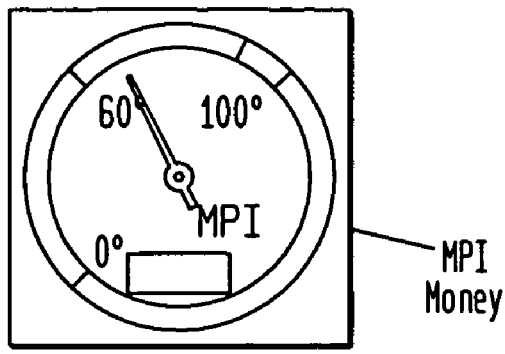
— MPI Money
Metrics
Fossil Fuel
Electricity
Natural Gas
Oil
?
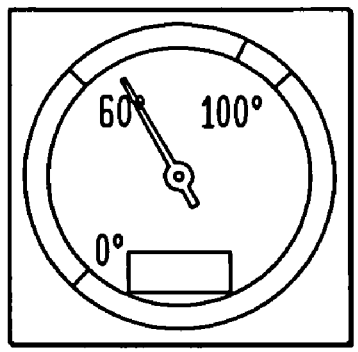
Renewable
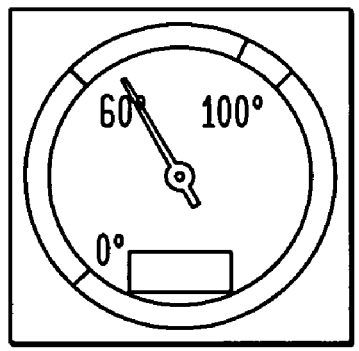
TO FIG 9C3

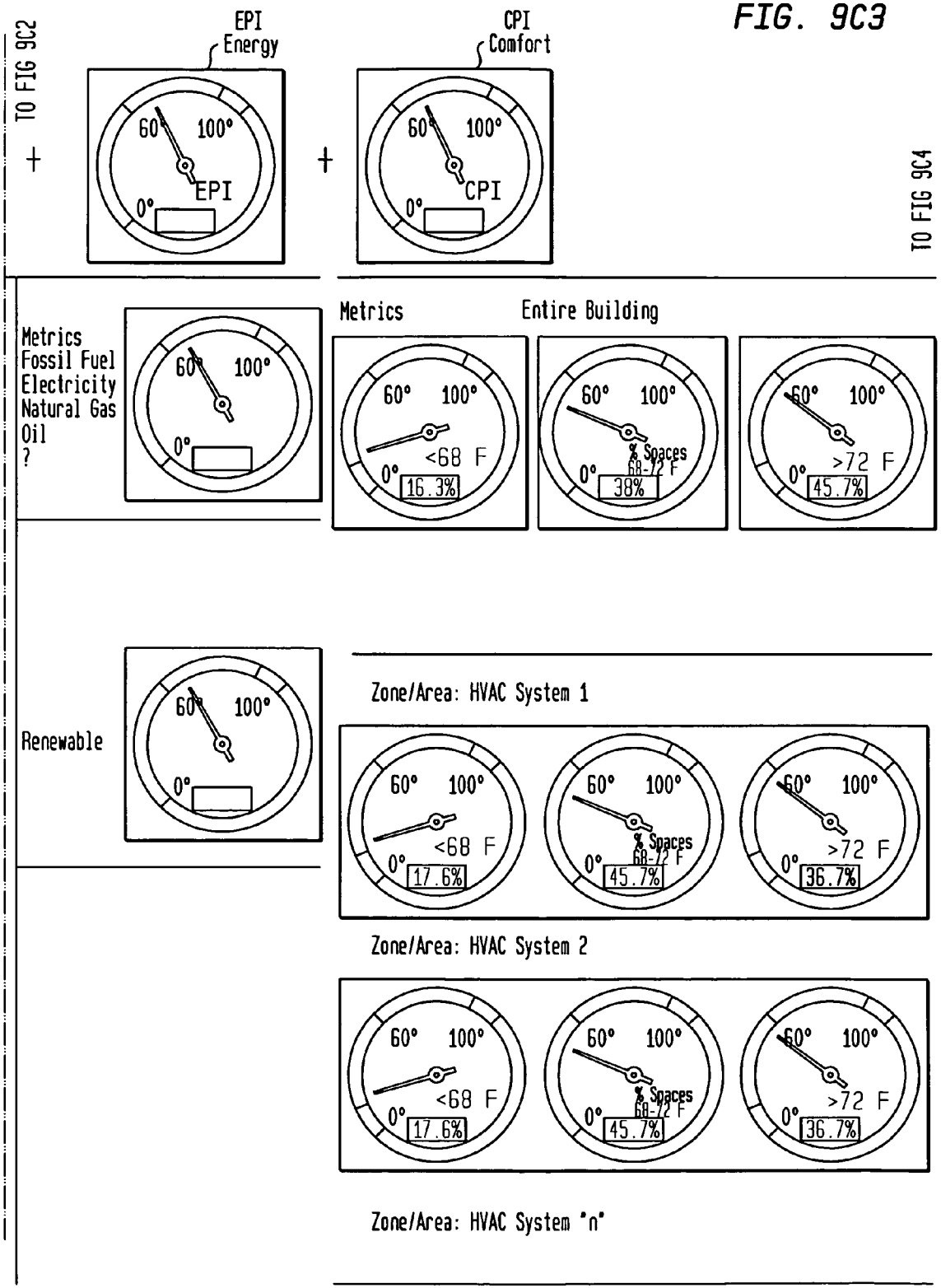
FIG. 9C3

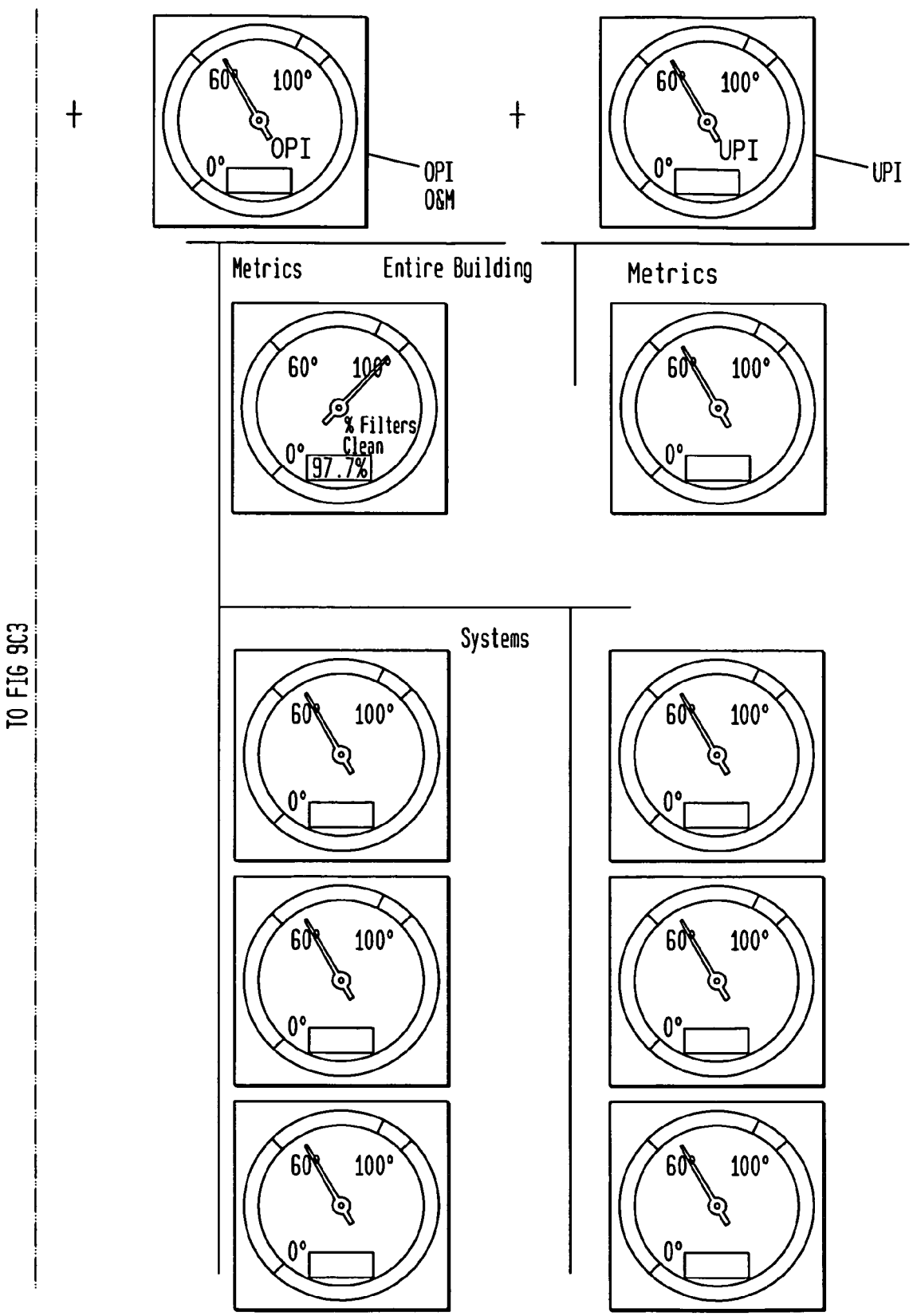
FIG. 9C4

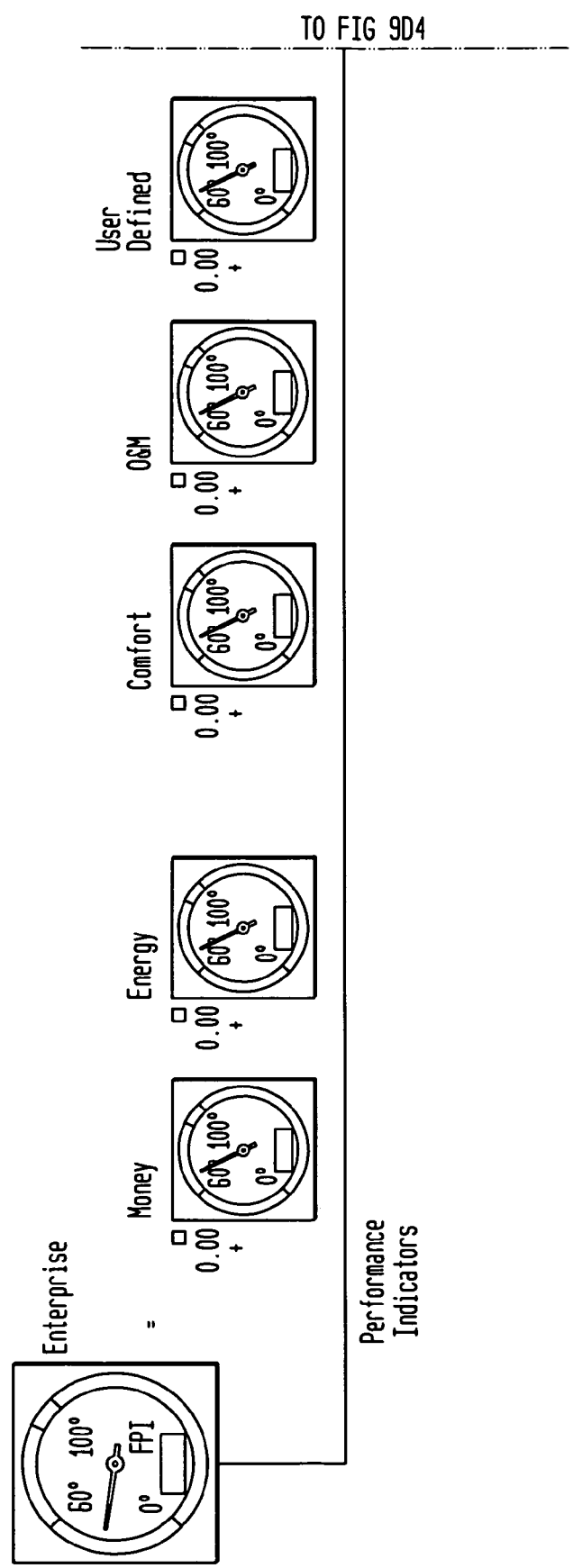

FIG. 9D2
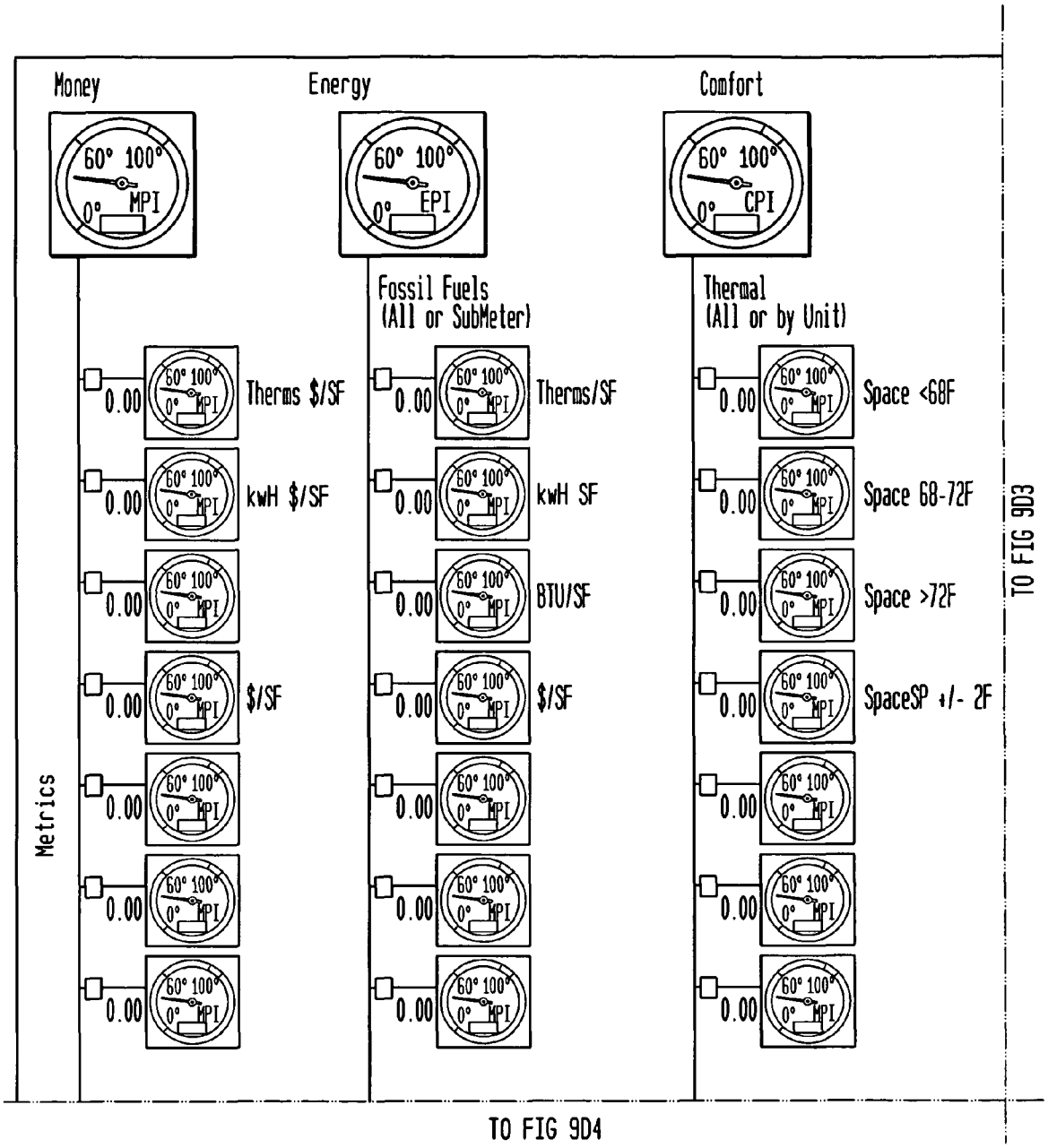

FIG. 9D3
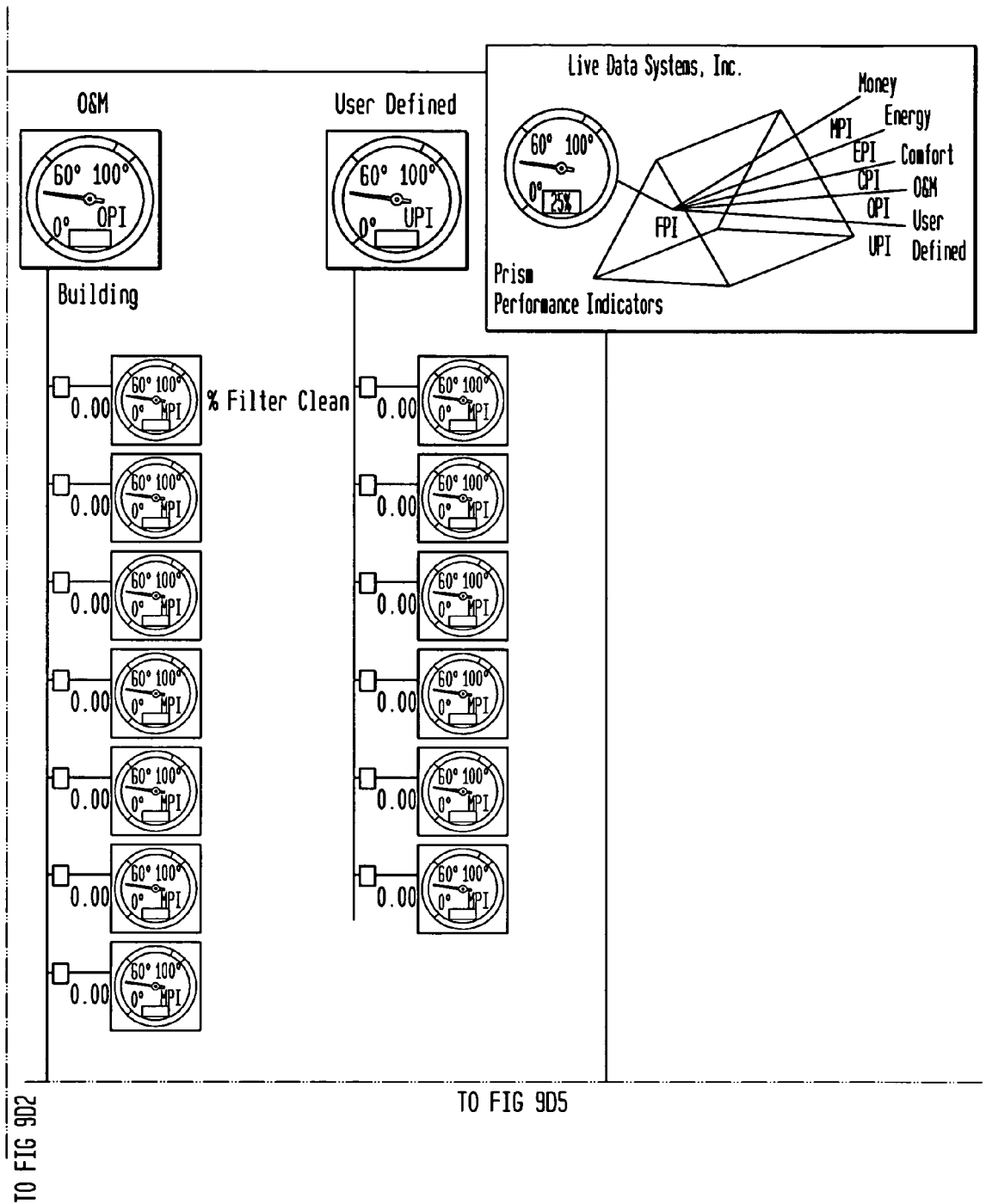

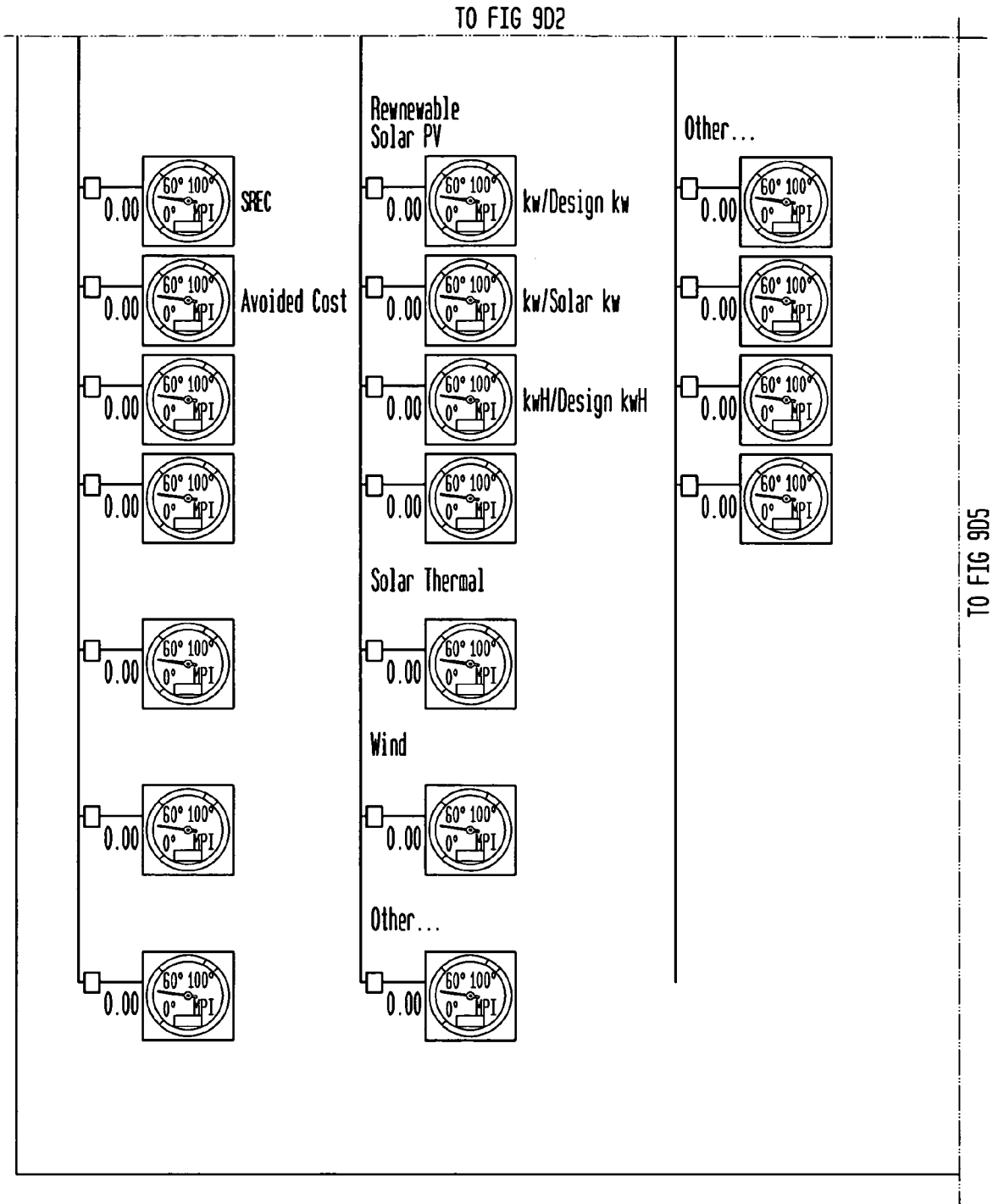
FIG. 9D4

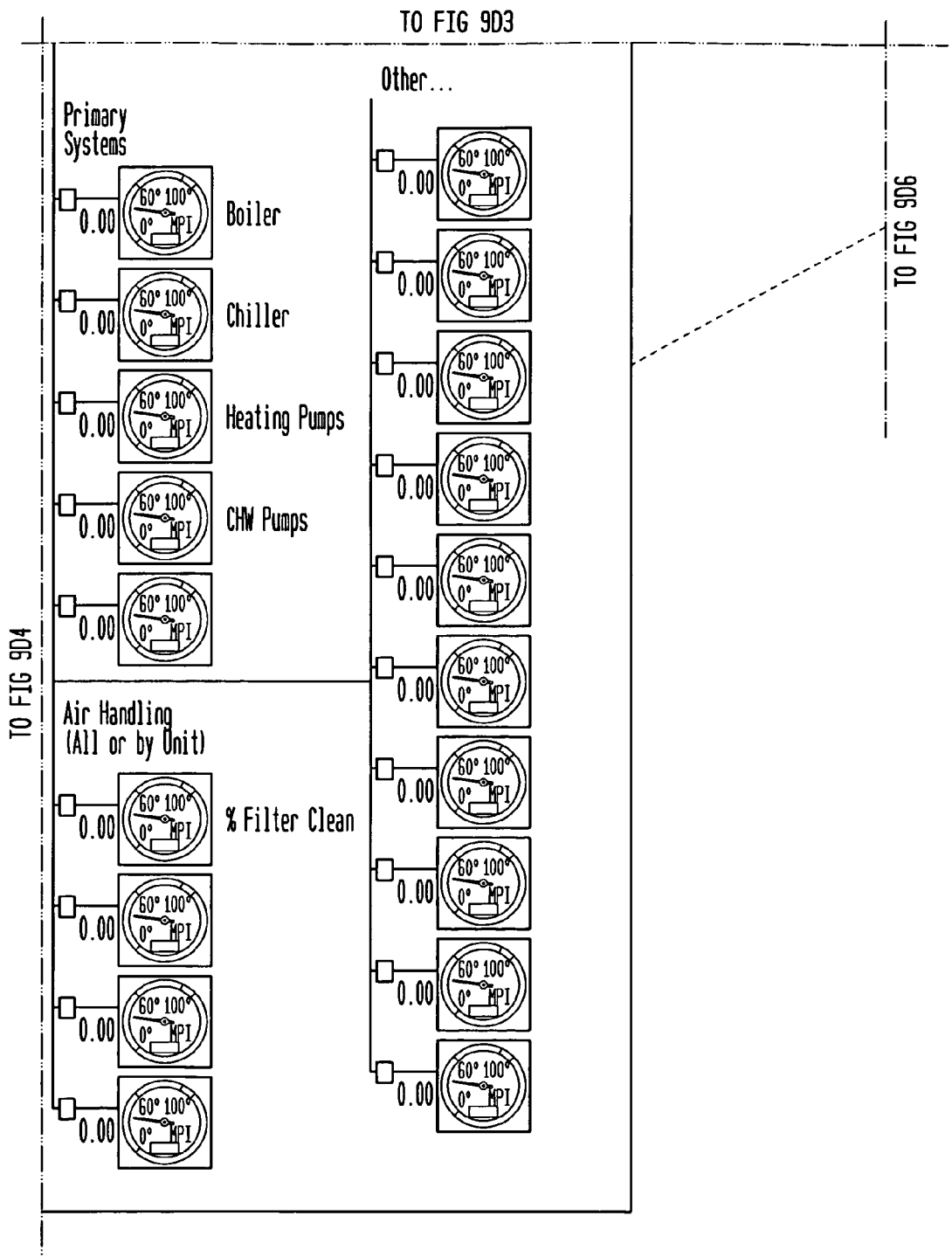
FIG. 9D5

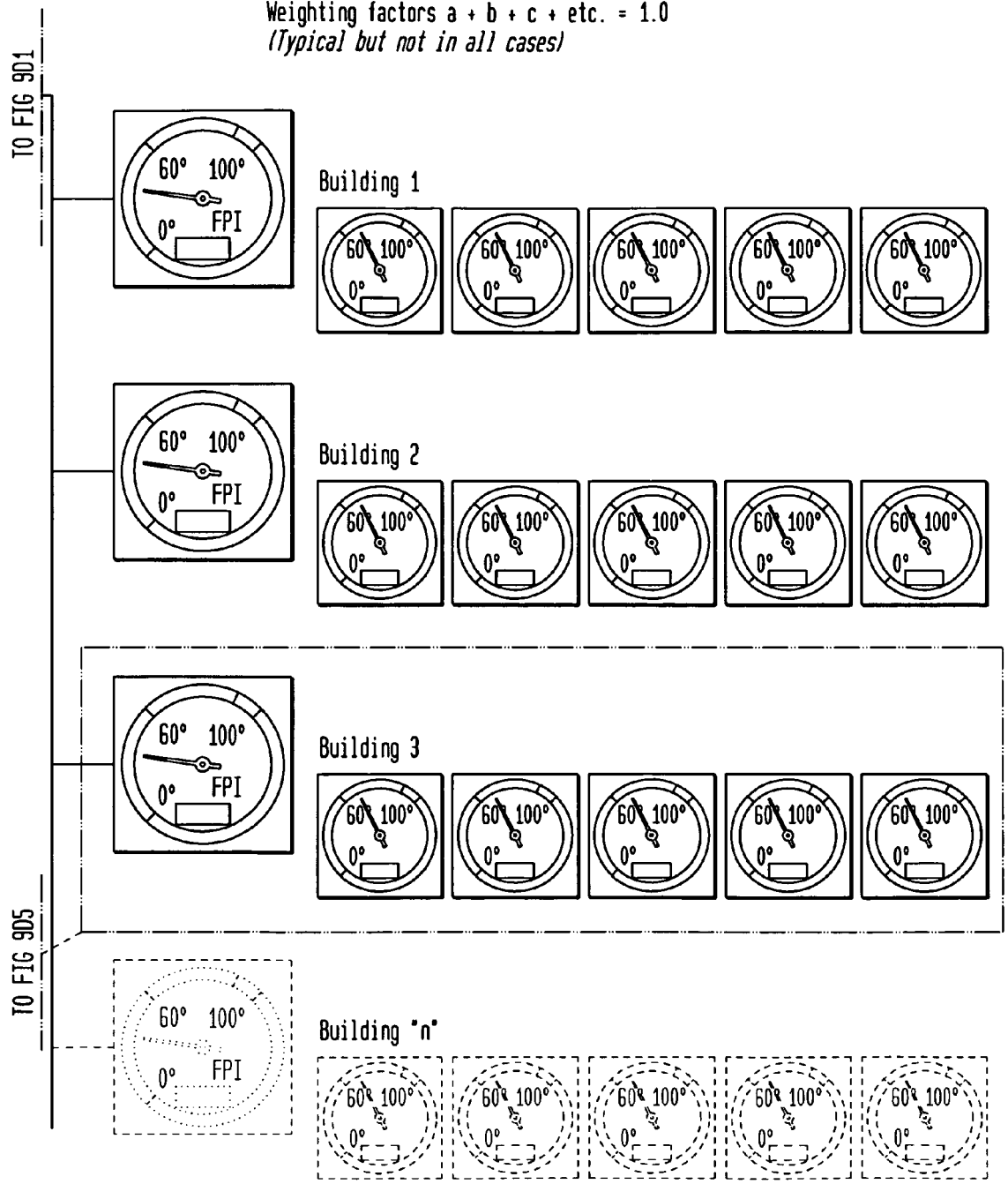
FIG. 9D6

SYSTEM AND METHOD FOR MONITORING AND MANAGING ENERGY PERFORMANCE

CROSS REFERENCE TO RELATED APPLICATION

This application claims the benefit of the filing date of U.S. Provisional Patent Application No. 60/922,637 filed Apr. 9, 2007, the disclosure of which is hereby incorporated herein by reference.

BACKGROUND OF THE INVENTION

Energy usage in facilities, such as buildings, is a large expense. In a campus environment including many buildings, energy usage can cost millions of dollars per year. Managing these costs so that energy costs are minimized while maintaining acceptable performance is a challenge.

Computerized energy management systems ("EMSs") that can provide for monitoring and managing energy usage in various types of facilities are known. In typical EMSs, a user, such as an operator, uses a mouse or keyboard to navigate various screens displayed on a computer monitor, and to select various displayed options and actions. An EMS generally provides detailed information but no context or meaning, and requires specialized training and expertise to interpret the information and take appropriate action. The determination of how an entire building or campus is operating at any give time, such as by review of operational parameters and also based on adjustments made to building system operations, can take hours of navigating screens and interpreting data, and scores or even thousands of mouse clicks and keystrokes. By the time this process is finished, the building conditions may have already changed, making the gathered data not representative of current conditions and decisions based on the data untimely.

Thus, known EMSs do not provide the energy and operations information for a facility needed to determine the energy performance of the facility, and further provide that adequate monitoring of facility operations can be performed and appropriate actions can be taken based on the energy performance determinations.

The failings of the prior art are manifest in numerous real world deficiencies. For example, without real time information that accounts for the large number of variables associated with energy management, which may include thermostat settings, energy usage from devices such as computers, sun height related to seasonality, cloud cover, external temperature and overall energy demand in the energy grid, understanding of energy flow is compromised.

Therefore, there exists a need for system and method for monitoring facility operations and energy information which provides that accurate energy performance information for the facility may be readily available, in an easily understandable form, in substantially real time and used for substantially real time management of energy performance and operations at the facility, and also verified reporting of energy performance at the facility.

SUMMARY OF THE INVENTION

In accordance with an aspect of the present invention, renewable energy generation at a facility may be monitored in substantially real time, and in addition export of renewable energy from, import of energy, such as from a public utility, to, and consumption of energy at, the facility may be monitored in substantially real time, and optionally time correlated with the monitoring of the renewable energy generation. The monitored energy data may be processed for managing, and providing for rendering of indicators of, energy performance of the facility, in substantially real time.

In one embodiment of the invention, the monitored data may be collected at the facility and communicated over a communications network to an energy management server. The server may process the monitored information, and display energy performance indicators on a communications network interface, such as an Internet website, in substantially real time. The performance indicators may include instantaneous energy generation, import, export and consumption values and indicia of whether the facility is importing or exporting energy.

In another aspect of the invention, environmental conditions within or at the exterior of the facility may be monitored in substantially real time, and also optionally time correlated with the energy monitoring. The monitored environmental conditions data may be processed with the monitored energy data for determining the energy performance of the facility. The environmental conditions may include weather conditions at the exterior of the facility, such as temperature, wind speed and wind direction; temperature of a solar panel mounted on a roof of the facility; amount of solar radiation available for absorption by the solar panel; and temperatures of a room or unit within the facility.

In another aspect of the invention, facility operations within or at the exterior of the facility may be monitored in substantially real time, and optionally time correlated with the energy and environmental conditions monitoring. The monitored facility operations data may be processed with the monitored energy and environmental conditions data for determining the energy performance of the facility. The facility operations may include positions of respective regulators at selected duct portions of a heating, ventilation and air conditioning ("HVAC") system in the facility; temperatures at the selected duct portions of the HVAC system; operating mode of a thermostat in a room of the facility; and operating mode of an exhaust fan on the roof of the facility.

In a further aspect of the invention, the monitored energy data may be processed for certifying energy performance of the facility, and for determining performance indicators which may be displayed in substantially real time and show differences between actual and expected renewable energy generation at, and between energy importation to and energy exportation from, the facility.

In another aspect of the invention, the monitored energy data may be processed for reporting, in substantially real time, energy generation at and energy import to the facility, over a communications network to, for example, an energy trading or an energy usage compliance entity. In one embodiment, the reporting includes indicators of carbon footprint and compliance with an energy conservation program for the facility.

BRIEF DESCRIPTION OF THE DRAWINGS

Other objects and advantages of the present invention will be apparent from the following detailed description of the present preferred embodiments, which description should be considered in conjunction with the accompanying drawings in which like reference indicate similar elements and in which:

FIG. 8 is an illustration of an exemplary display in accordance with an aspect of the present invention.

FIGS. 9A, 9B, 9C and 9D are illustrations of exemplary displays of performance indicators in accordance with an aspect of the present invention.

DETAILED DESCRIPTION

Figure 1:
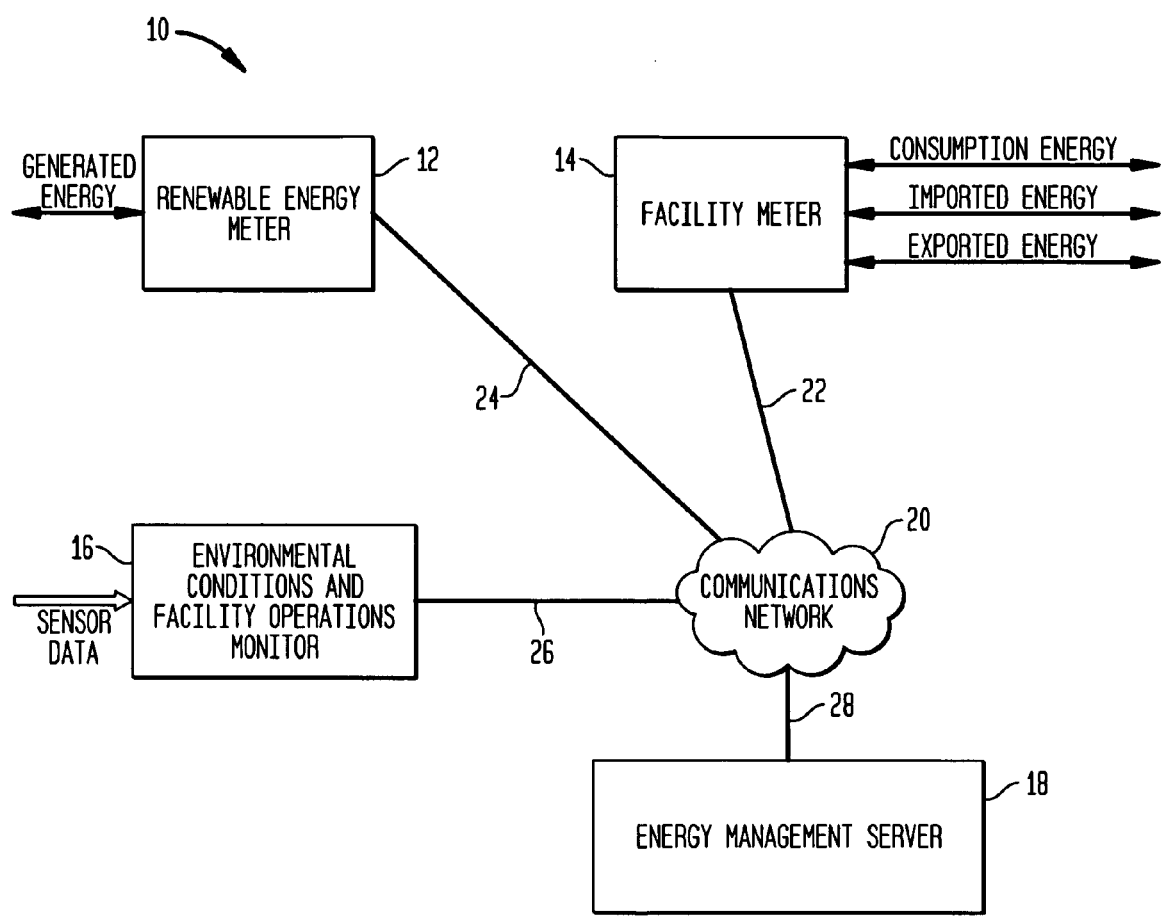
FIG. 1 is a block diagram of an exemplary system in accordance with an aspect of the present invention.

FIG. 1 is an exemplary system 10 for managing energy performance of a facility, in accordance with an aspect of the present invention. Referring to FIG. 1, the system 10 may include a renewable energy meter 12, a facility meter 14 and an environmental conditions and facility operations monitor 16, each of which has communications capabilities and can be communicatively coupled to an energy management server 18 over a communications network 20, such as the Internet. Communication links 22, 24, 26 and 28, which may be wireless or wired, can be established between the network 20 and the meters 12, 14, the monitor 16 and the server 18, respectively.

It is to be understood that each of the components in the meters 12, 14, the monitor 16 and the server 18 which is described below as performing data processing operations is a software module or, alternatively, a hardware module or a combined hardware/software module. In addition, each of the data processing modules in the meters 12, 14, the monitor 16 and the server 18 suitably contains a memory storage area, such as RAM, for storage of data and instructions for performing processing operations, and a processor for executing data processing instructions and processing data, in accordance with the present invention. Alternatively, instructions for performing processing operations can be stored in hardware in one or more memories in the meters 12, 14, the monitor 16 and the server 18.

In addition, it is to be understood that a "facility" may include any defined space or region of a structure, such as a room or floor of a commercial or residential building; a building; spaces within one or more buildings; a plurality of buildings; any combination of spaces within respective buildings; a site or land location having some form of capital improvement, for example, a solar panel array; and a mechanical, electrical or plumbing system or sub-system, such as a boiler, a chiller, an air handler, a pump, a valve, a terminal device, or an electrical switchgear, distribution or load center.

Figure 2:
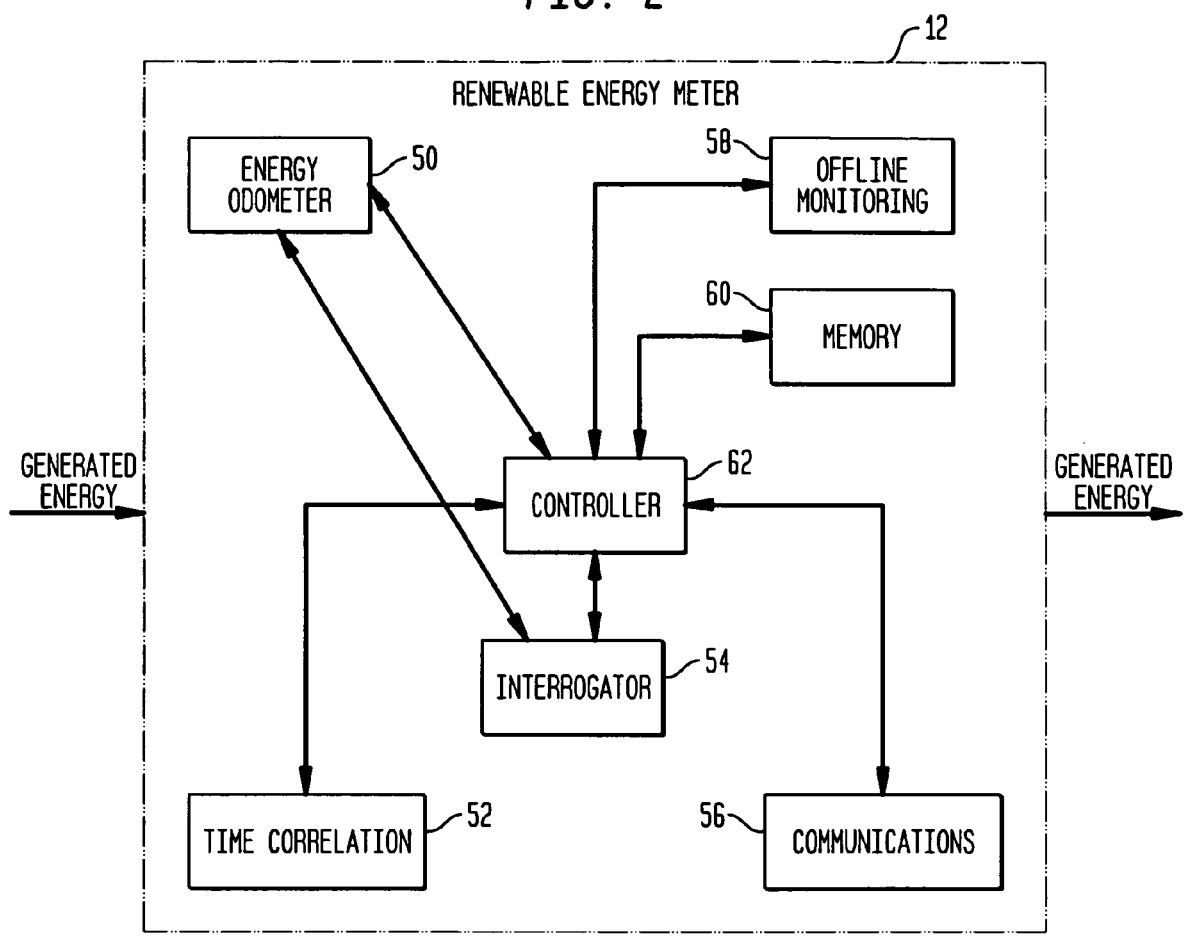
FIG. 2 is a block diagram of an exemplary renewable energy meter in accordance with an aspect of the present invention.

Referring to FIG. 2, which illustrates an exemplary renewable energy meter 12, the meter 12 may include a renewable energy odometer 50, a time correlation module 52, a interrogator module 54, a communications module 56, an offline monitoring module 58 and a memory 60, each of which is coupled to a controller 62. In addition, the interrogator module 54 is coupled to the odometer module 50.

The energy odometer 50 may include a relatively high accuracy meter, such as a Web Enabled Electric Meter sold by Energy Tracking, LLC, for measuring, and supplying data representative of, the amount of alternating current ("AC") or direct current ("DC") electrical energy, in KwH, conveyed on an electrical energy conveying medium, such as an electrical power transmission line, over time. In one embodiment, the odometer 50 may include an ammeter and voltmeter for supplying instantaneous voltage and current values, respectively, for the electrical energy being conveyed. Further, the odometer 50 may determine, and supply data representative of, the instantaneous rate of energy flow, in Kw, on the power line. The energy odometer 50 may be coupled, for example, to an electrical power transmission line extending from a renewable energy generator, such as a solar panel array or wind turbine, which generates renewable energy as DC electrical power. The odometer 50 is preferably coupled to the power line to provide that the flow of renewable energy on the line, subsequent to a position on the line at which the odometer 50 is coupled, is the same or substantially the same as the flow of renewable energy on the line preceding the coupling position. In alternative embodiments, the energy odometer 50 may be coupled to an electrical power line on which the renewable energy is conveyed (i) in its originally generated, DC form; or (ii) as AC energy following inversion, with or without voltage step-up or step-down at a transformer.

In one embodiment of the odometer 50, for measurement of the amount of electrical energy conveyed over time, the odometer 50 may be non-resettable, or alternatively resettable, for example, hourly, daily, monthly or yearly.

It is to be understood that the use of the term "data representative of" herein may mean the actual information of interest, or information which is based on the actual information of interest. For example, data representative of the instantaneous rate of energy flow may be the actual rate, such as 10 Kw, or a value determined based on the actual rate.

The communications module 56 may be a conventional, high speed data communications transceiver providing for high speed exchange of communications data signals between the meter 12 and a remote communications device, such as the server 18. In one embodiment, the communications module 56 may forward to the controller 62 data contained in communication signals received from the server 18 and transmit to the server 18 communications signals including data supplied by the controller 62.

The memory module 60 may be any conventional data storage device providing for high speed data retrieval, and may include a random access memory ("RAM") or read only memory ("ROM").

The time correlation module 52 may include a processor containing a master time clock which the processor maintains correlated, and preferably synchronized, to a reference clock. The reference clock, for example, may be found on a website accessible via the network 20. The processor in the module 52, at predetermined intervals, may request from the reference clock website, via the controller 62 and the communications module 56, clocking information for ensuring that the master time clock is correlated to the reference clock. The processor in the module 52 suitably adjusts the master clock for transmission and data processing delay between the source, such as the reference clock website, and the module 52. The module 52 further supplies to the controller 62 time correlation information, based on the master time clock, such as every second.

In the description of the invention that follows, although data may be routed from a module to a controller within the same component, such as the meter 12, and then from the controller to a communications module also within the same component, or vice versa, for ease of reference when the module operates to request transmission of data over the communications network 20, or receives data contained in a signal transmitted over the network 20, the routing of data between the controller and the associated communications module is not mentioned in connection with the description of such data transfer.

The interrogator module 54 may collect energy data, which is supplied at the odometer 50, automatically, or alternatively based on interrogation requests received at the meter 12 from the server 18. For example, the controller 62, based on the time correlation information supplied by the time module 52 and the received interrogation requests, may transmit an interrogation control signal to the module 54 every five seconds. The interrogation control signal, in turn, may cause the module 54 to retrieve from the odometer 50 data representative of the instantaneous amount of renewable energy which has been generated by a renewable energy generator for a facility to which the system 10 is coupled for managing energy performance, or the instantaneous rate of renewable energy generation by the renewable energy generator. The module 54 may route the retrieved data to the controller 62, and the controller 62 may associate with the retrieved data, for example, the amount of renewable energy generated in KwH as of the time of retrieval of the data from the odometer 50, a time stamp representative of the time of the master clock at which the module 54 retrieved the renewable energy data, and store the time stamped energy data in the memory 60 or transmit such information to the server 18.

In one embodiment, the meter 12 may be energized based on AC electrical power supplied from a conventional electrical power utility, or electrical energy supplied from an alternate energy source. In such embodiment, the offline monitoring module 58 may include a high accuracy contact meter, such as the Web Enabled Pulse Logger sold by Energy Tracking, LLC, for measuring DC electrical energy being conveyed over an electrical energy conveying medium such as an electrical power transmission line, when electrical power for energizing the meter 12 is unavailable. In the event power from the utility and alternate energy source is unavailable, the contact meter within the module 58 may continue to measure renewable energy generation based on the opening and closing of contacts caused by the flow of renewable energy therethrough, as well known in the art. The opening and closing of the contacts advance an analog counter in the module 58, whose operation does not require electrical power. The value of the analog counter represents the amount of renewable energy that has flowed over the line since measurement by the contact counter commenced.

In one embodiment of the module 58, for measurement of the amount of electrical energy conveyed over time, the module 58 may be non-resettable, or alternatively resettable, for example, hourly, daily, monthly or yearly.

The controller 62 may be a conventional, high speed processor for performing data processing operations, and exchanging data with other components within the meter 12, for implementing the features of the present invention, as discussed below.

It is noted that the retrieval, routing and processing of data within the meter 12 is performed at sufficiently high speeds to provide for transmission of retrieved energy data to the server 18 in substantially real time, in response to a request for renewable energy generation data received at the meter 12 from the server 18.

Figure 3:
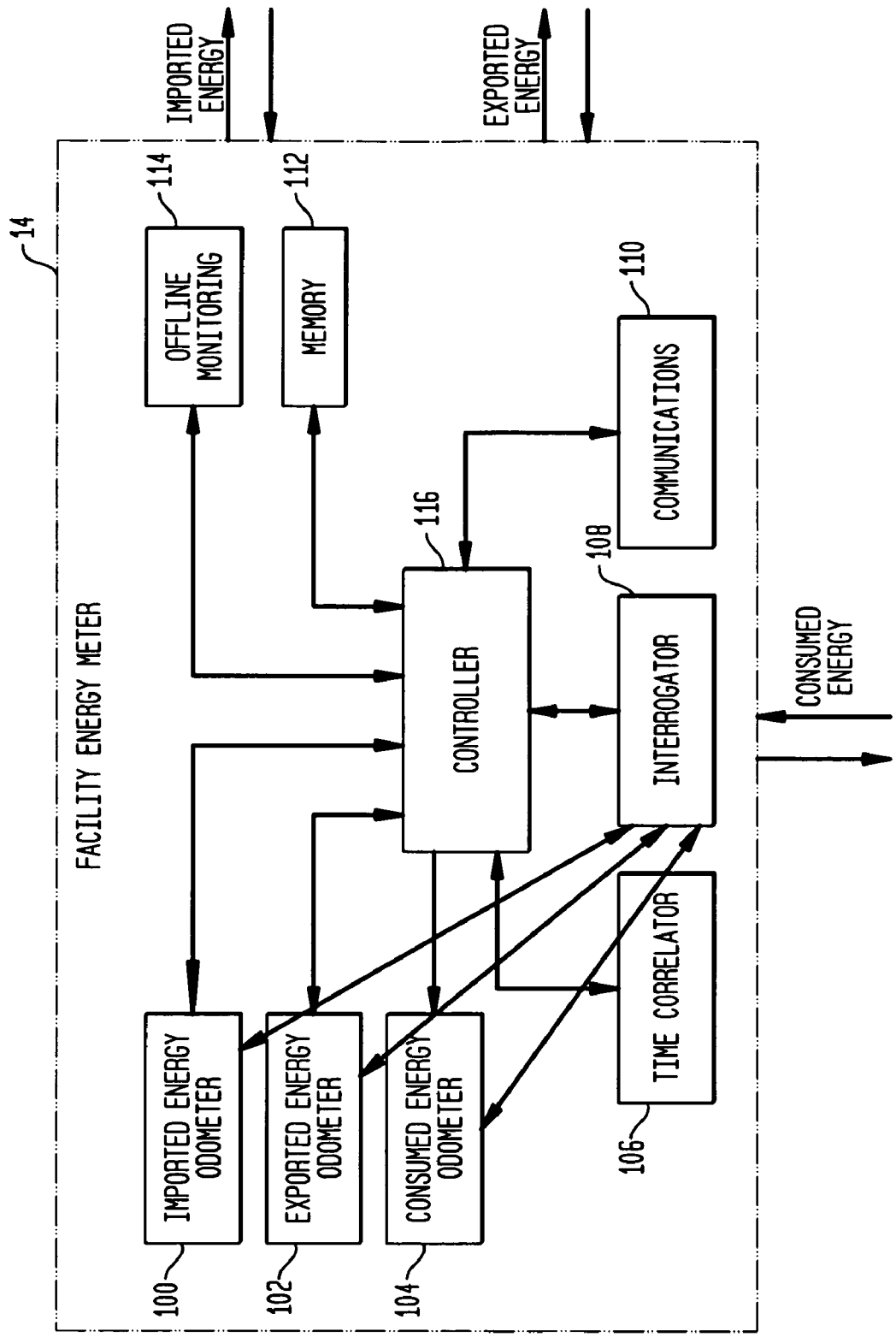
FIG. 3 is a block diagram of an exemplary facility energy meter in accordance with an aspect of the present invention.

Referring to FIG. 3, which illustrates an exemplary facility energy meter 14, the meter 14 may include an imported energy odometer 100, an exported energy odometer 102, a consumed energy odometer 104, a time correlation 106, an interrogator module 108, a communications module 110, a memory 112 and an offline monitoring module 114, each of which is coupled to a controller 116. In addition, the interrogator module 108 is coupled to each of the odometers 100, 102 and 104.

The odometers 100, 102 and 104 may be identical, or substantially similar, in construction and operation as the odometer 50, as described above.

The odometer 100 may be for measuring, and supplying data representative of, the instantaneous amount of AC electrical energy which has been received at, or the instantaneous rate of flow of the AC electrical energy to, a facility, over an electrical energy conveying medium, from a source not a part of the facility ("imported energy"), for example, a conventional power utility, to which the system 10 is coupled. In one embodiment, the odometer 100 may determine, and supply data representative of, the instantaneous amount of imported energy in KwH and the instantaneous rate of imported energy flow in Kw.

The odometer 102 may be for measuring, and supplying data representative of, the instantaneous amount of renewable AC electrical energy which has been conveyed, or the instantaneous rate of flow of the renewable AC electrical energy, on an electrical energy conveying medium away from the facility ("exported energy") to, for example, a power grid operated by a conventional power utility. In one embodiment, the odometer 102 may determine, and supply data representative of, the instantaneous amount of exported energy in KwH and the instantaneous rate of exported energy flow in Kw.

The odometer 104 may be for measuring, and supplying data representative of, the instantaneous amount of AC electrical energy which has been consumed, or the instantaneous rate of consumption of AC electrical energy, by energy consumption devices within the facility. The consumed AC energy, which is conveyed over an electrical energy conveying medium to the devices within the facility, may include only renewable energy generated at the facility, only imported energy or both renewable and imported energy. In one embodiment, the odometer 104 may determine, and supply data representative of, the instantaneous amount of AC electrical energy consumed at the facility in KwH and the instantaneous rate of AC electrical energy consumption at the facility in Kw.

The communications module 110 may be identical, or substantially similar, in construction and operation as the communications module 56, as described above. The module 110 may provide for high speed exchange of communications data signals between the meter 14 and a remote communications device, such as the server 18. In one embodiment, the communications module 110 may forward to the controller 116 data contained in communication signals received from the server 18 and transmit to the server 18 communications signals including data supplied by the controller 116.

The memory module 112 may be identical, or substantially similar, in construction and operation as the memory module 60.

The time correlation 106 module may be identical, or substantially similar, in construction and operation as the time correlation module 52. The module 106 may maintain a master time clock correlated, and preferably synchronized, to the same reference clock that the module 52 uses for time correlation, and adjust for transmission delay between the clocking reference website source and the module 106 and also data processing delay as needed. The module 106 further may supply to the controller 116 time correlation information based on the master clock, such as every second.

The interrogator module 108 may be identical, or substantially similar, in construction and operation as the interrogator module 54. The module 108 may collect measurement data, which is supplied at each of the odometers 100, 102 and 104, automatically, or alternatively based on interrogation requests received at the meter 14 from the server 18. For example, the controller 116, based on the time correlation information supplied by the time module 106 and the received interrogation requests, may transmit an interrogation control signal to the module 108 every five seconds. The interrogation control signal, in turn, may cause the module 108 to retrieve from each of the odometers 100, 102, 104 measurement data representative of the instantaneous amount of imported energy, exported energy and consumed energy, or the rate of export of renewable energy from, import of utility energy to, and consumption of energy at, the facility. The module 108 may route the retrieved energy data values to the controller 116. The controller 116 then may associate with the energy measurement data a time stamp representative of the time of the master clock at which the energy data was retrieved, and store the time stamped energy data in the memory 112 or transmit such information to the server 18.

In one embodiment, the meter 14 may be energized using electrical power obtained from a conventional electrical power utility or a battery. In such embodiment, the offline monitoring module 114 may be identical, or substantially similar, in construction and operation as the monitoring module 58. The module 114 may be used for measuring, and supplying data representative of, the export of electrical energy from, and consumption of electrical energy, at the facility when power for energizing the meter 14 is unavailable. In the event utility and battery power are unavailable, the contact meter in the module 114 may continue to measure the energy export from, and the energy consumed at, the facility to which meter 14 is coupled.

The controller 116 may be identical, or substantially similar, in construction and operation as the controller 62, and perform data processing operations, and exchanging data with other components within the meter 14, for implementing the features of the present invention, as discussed below.

Similarly as for the meter 12, the retrieval, routing and processing of data within the meter 14 is preferably performed at sufficiently high speeds to provide for transmission of energy data to the server 18 in substantially real time, in response to a request for energy data received at the meter 14 from the server 18.

Figure 4:
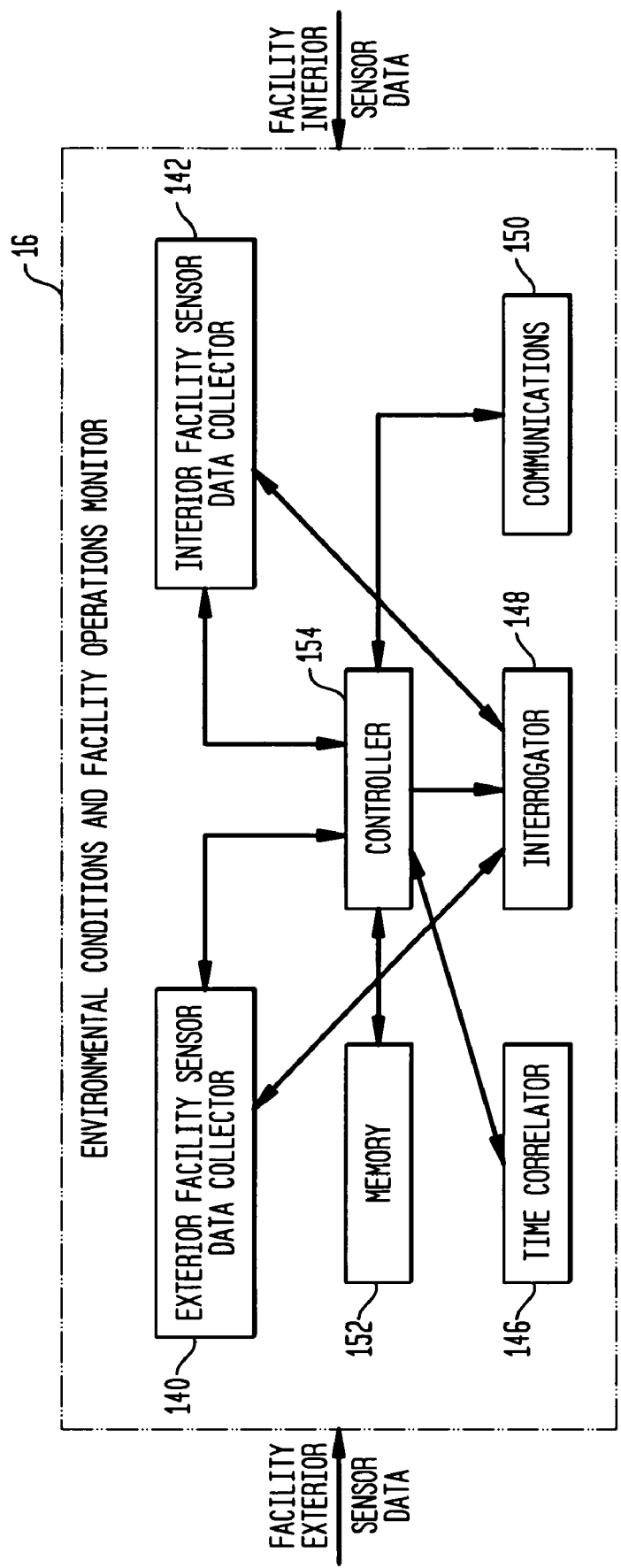
FIG. 4 is a block diagram of an exemplary environmental conditions and facility operations monitor in accordance with an aspect of the present invention.

Referring to FIG. 4, which illustrates an exemplary environmental conditions and facility operations monitor 16, the monitor 16 may include an exterior of facility sensor data collector 140, an interior of facility sensor data collector 142, a time correlation module 146, an interrogator module 148, a communications module 150 and a memory module 152, each of which is coupled to a controller 154.

The collector 140 may be coupled, via a high speed data communications cable, such as an Ethernet or optical fiber cable, or a copper wire, to one or more sensors of environmental conditions, or devices associated with energy performance of a facility, located at an exterior of the facility and which supply analog or digital sensor data representative of an environmental condition or an operating condition of a facility device being detected. The collector 140 may retrieve the sensor data, which may be an analog voltage or a digital code, supplied at the sensor and forward the sensor data to the controller 154. For example, the sensor may be a thermometer detecting air temperature outside the facility, a thermometer detecting the temperature of a solar panel of a solar panel array on the roof of the facility and which is the renewable energy generator for the facility, a solar radiation detector on the roof of the facility, a wind speed and direction detector also on the roof, or a damper position indicator of a damper of an exhaust fan on the roof of the facility. The sensor may supply sensor data, for example, a digital code representative of the outside temperature, and include a data output port to which a suitable communications cable or copper wire can be coupled for retrieving and routing, from the sensor to a remote device, such as the collector 140, of the digital code constituting the sensor data.

The collector 142 may be identical, or substantially similar, in construction and operation as the collector 140. The collector 142 may be coupled to sensors within the facility, similarly as the collector 140, where the sensors may include a thermostat in a room of the facility, a thermostat of a hot water heater for the facility, a thermostat of an HVAC system for the facility and a damper position indicator of a damper for a ventilator unit in a room of the facility. Similar to the collector 140, the collector 142 may be coupled to the sensors to provide for retrieval of the sensor data supplied by the sensors within the interior of the facility to which the collector 143 is coupled.

The communications module 150 may be identical, or substantially similar, in construction and operation as the communications module 56, as described above. The module 150 provides for high speed exchange of communications data signals between the monitor 16 and a remote communications device, such as the server 18. In one embodiment, the communications module 150 may forward to the controller 154 data contained in communication signals received from the server 18 and transmit to the server 18 communications signals including data supplied by the controller 154.

The memory module 152 may be identical, or substantially similar, in construction and operation as the memory module 60.

The time correlation 146 module may be identical, or substantially similar, in construction and operation as the time correlation module 52. The module 146 may maintain a master time clock correlation, and preferably synchronized, to the same reference clock that the module 52 uses for time correlation, and adjusts for transmission delay between the clocking reference website source and the module 146 and data processing delay as needed. The module 146 further may supply to the controller 154 time correlation information based on the master time clock, such as every second.

The interrogator module 148 may be identical, or substantially similar, in construction and operation as the interrogation module 54. The module 148 may retrieve sensor data from each of the collectors 140 and 142 automatically, or alternatively based on interrogation requests received at the monitor 16 from the server 18. For example, the controller 154, based on the time correlation information supplied by the time module 146 and the received interrogation requests, may transmit an interrogation control signal to the module 148 every five seconds. The interrogation control signal, in turn, may cause the module 148 to retrieve from each of the collectors 140, 142 sensor data representative of the environmental conditions and facility operations detected at sensors within the interior of and exterior to the facility. The module 148 may route the retrieved sensor data to the controller 146. The controller 146 may then associate the sensor data with a time stamp representative of the time of the master clock at which the sensor data was retrieved, and store the time stamped sensor data in the memory 152 or transmit such information to the server 18.

Figure 5:
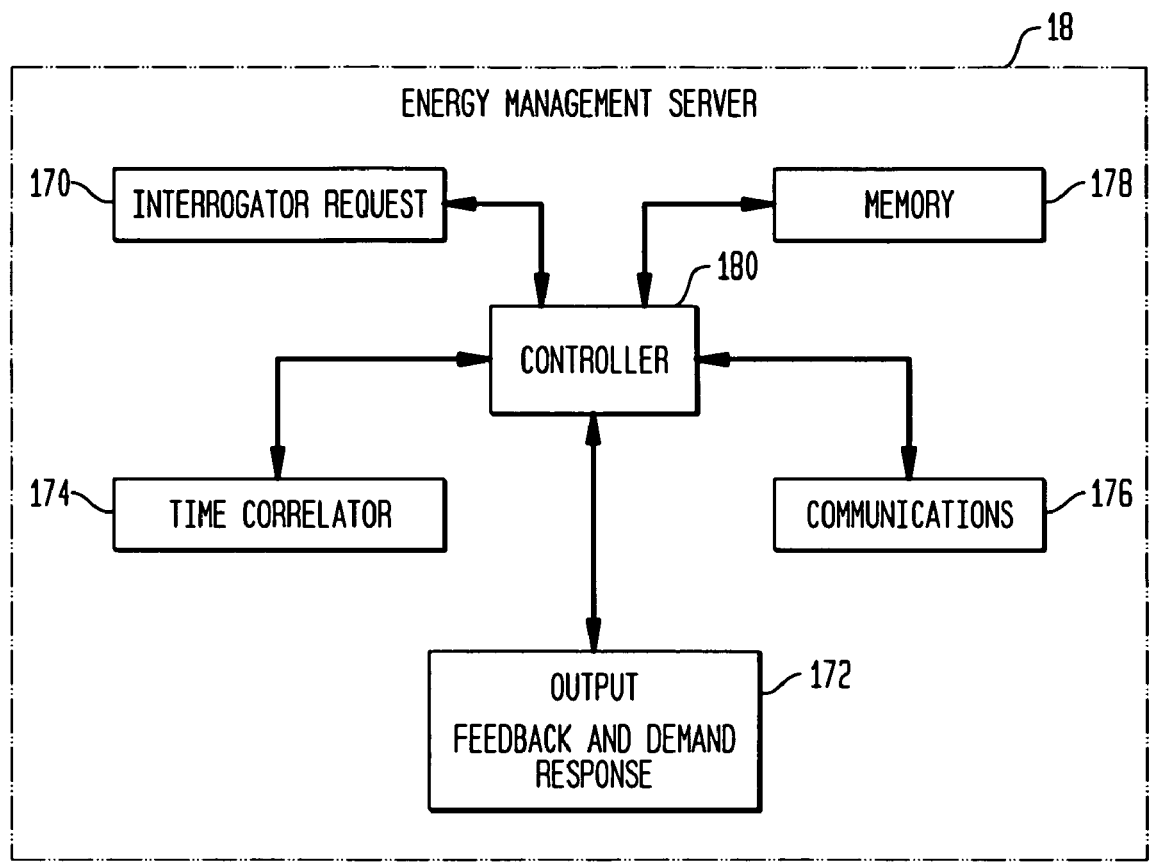
FIG. 5 is a block diagram of an exemplary energy management server in accordance with an aspect of the present invention.

Referring to FIG. 5, which illustrates an exemplary energy management server 18, the server 18 may include an interrogator request module 170, an output feedback and demand response module 172, a time correlation module 174, a communications module 176 and a memory module 178, each of which is coupled to a controller 180.

The time correlation 174 module may be identical, or substantially similar, in construction and operation as the time correlation module 52. The module 174 may maintain a master time clock correlated, and preferably, synchronized to the same reference clock that the module 52 uses for time correlation, and adjusts for transmission delay between the clocking reference website source and the module 174 and data processing delay as needed. The module 174 further may supply to the controller 180 time correlation information based on the master time clock, such as every second.

The communications module 176 may be identical, or substantially similar, in construction and operation as the communications module 56, as described above. The module 150 provides for high speed exchange of communications data signals between the server 18 and a remote communications device, such as the meters 12, 14 or the monitor 16. In one embodiment, the communications module 150 may forward to the controller 180 data contained in communication signals received from the meters 12, 14 or the monitor 16, and transmit to the meters 12, 14 or the monitor 16 communications signals including data supplied by the controller 180.

The memory module 152 may be identical, or substantially similar, in construction and operation as the memory module 60.

The interrogator request module 170 may generate an interrogation request signal based on time correlation information maintained at the time module 174. The request signals may be transmitted to, for example, the meters 12 and 14, for reception at the interrogator modules 54 and 108, respectively, to provide that the modules 54 and 108 retrieve energy measurement data from the odometers within the meters having predetermined time stamps. Following retrieval of the energy measurement data by the interrogator modules 54 and 108, the measurement data may be transmitted to the controller 180 of the server 18 in substantially real time.

In one embodiment, the request signals may be transmitted from the server 18 to the meters 12, 14 at predetermined intervals, such as every five seconds based on the master time clock information at the time module 174, to cause transmission, in substantially real time, of energy measurement data to the server 18 from the meters 12, 14 having a time stamp corresponding to every five second interval timed by the master time clock. The retrieval of the time correlated, energy measurement data for the facility to which the system 10 is coupled at the server 18, in substantially real time, advantageously provides for substantially real time management of energy performance at the facility, in accordance with one aspect of the invention.

In another embodiment, the module 170 may generate, and transmit to the interrogator module 148 in the monitor 16, an interrogation request signal, also based on the master time clock information maintained at the time module 174, to provide that the module 148 retrieves environmental conditions and facility operations data from the sensors having a time stamp corresponding to every five second interval timed by the master time clock. The module 148 then may transmit the time correlated, environmental conditions and operations data to the controller 180 of the server 18, in substantially real time, so as to provide for substantially real time management of energy performance and devices associated with energy performance at the facility, in accordance with another aspect of the invention.

The output feedback and demand response module 172 may process the energy measurement data for determining energy performance at the facility and supplying energy performance results for rendering to, for example, a display, in substantially real time. In another embodiment, the output feedback and demand response module 172 may process the energy measurement data, and also the environmental conditions and operations data, for determining energy performance results, and also demand response information based on the energy performance determination, and for supplying the energy performance results to a display and the demand response information to an operation control system of a facility, such as to controllable thermostat in a room of a facility, in substantially real time, as discussed in detail below.

The controller 180 may be a conventional, high speed processor for performing data processing operations, and exchanging data with other components within the server 18, for implementing the features of the present invention, as discussed below.

In accordance with an aspect of the present invention, the system 10, in substantially real time, may collect energy information for a facility, and use the collected energy information to supply, also in substantially real time, indications of energy performance at the facility, such as renewable energy generation, export of renewable energy and energy consumption performance. In a further aspect of the present invention, the collected information may include environmental conditions and facility operations information for the facility and be used for supplying, in substantially real time, demand response control information to an operation control system in the facility as part of management of energy performance for the facility. For purposes of highlighting features of the present invention, an exemplary process 200 for managing energy performance of a facility, as shown in FIG. 6, is described below in connection with operations performed at components of the system 10, as described at FIGS. 1-5, coupled to a facility including a renewable energy generator that may be a solar panel array, where the facility may export renewable energy or import utility energy, as suitable, and include various sensors for monitoring environmental conditions and operations of devices associated with energy performance within and at the exterior of the facility.

Figure 6:
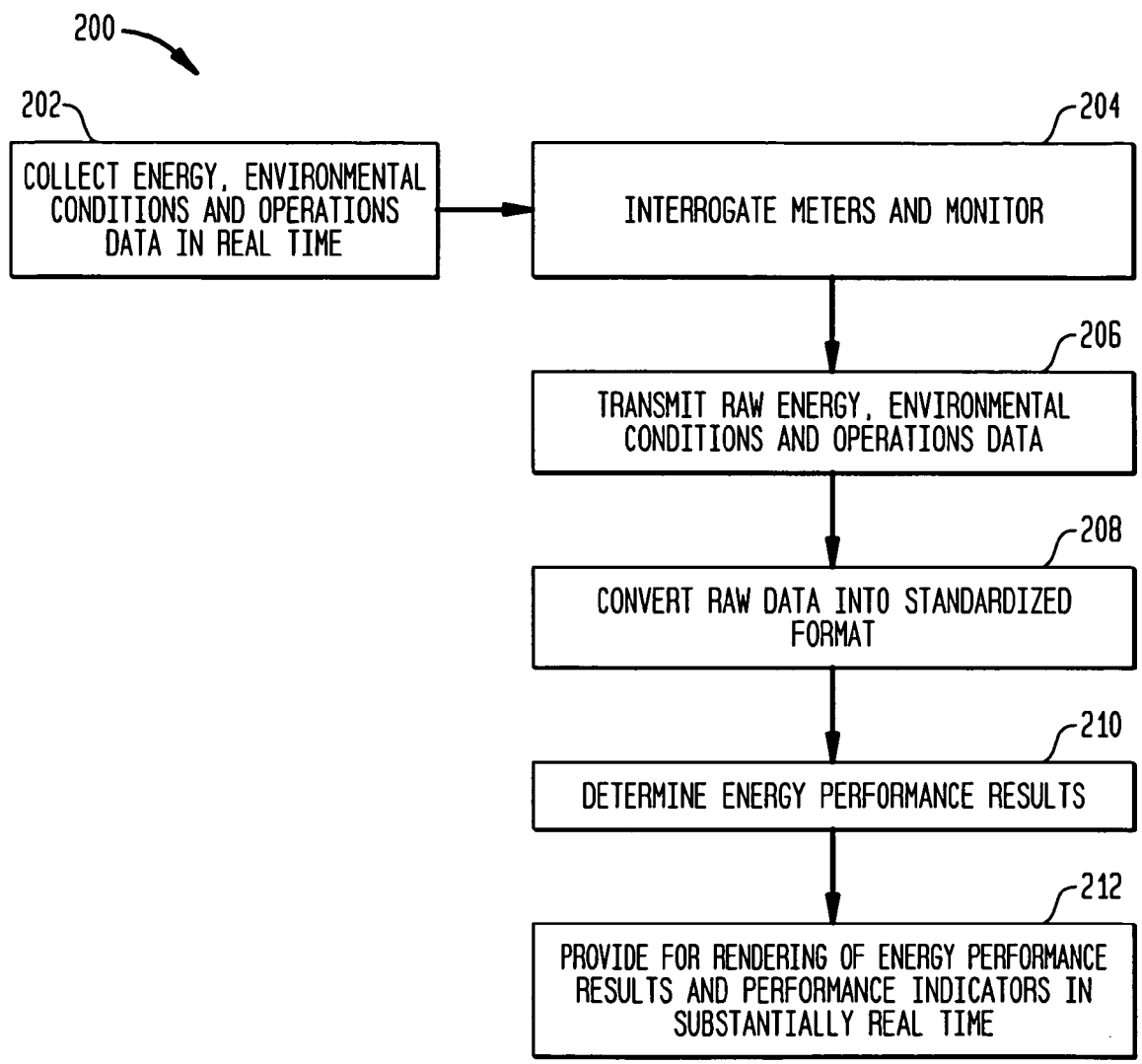
FIG. 6 is a flow diagram of a process in accordance with an aspect of the present invention.

Referring to FIG. 6, in block 202 energy information and also environmental conditions and facility operations information may be collected, in substantially real time, for the facility to which the system 10 is coupled. In an exemplary embodiment, the odometer 50 of the meter 12 may be coupled to an electrical power line conveying the DC electrical energy generated by the solar panel array located on the roof of the facility. The odometer 50 may generate at a predetermined time interval, for example, every second, digital data values representative of the instantaneous (i) amount of DC energy which has been generated by the solar panel in KwH; and (ii) rate of generation of renewable energy by the solar panel in Kw. The odometer 50 may include with each of the data values a corresponding time reference, which is based on the master clock time correlation information the time module 52 supplies to the controller 62. For example, the odometer 50 may store in its memory energy measurement data indicating that, since the beginning of the year 2008 when measurement of renewable energy generation for the facility commenced, the solar panel array for the facility has generated 100 KwH of renewable energy as of 7:00:00 a.m. on Jan. 10, 2008.

Also in the exemplary embodiment, the facility may include an electrical power line ("consumption line") which conveys all of the electrical energy to be consumed by the facility; an electrical power line extending between the facility and a conventional utility power grid node ("import line") on which imported, utility electrical energy is conveyed to the facility from the node; and an electrical power line extending between the facility and the conventional utility power grid node ("export line") on which exported (renewable) electrical energy is conveyed from the facility to the node. The odometer 104 may be coupled to the consumption line and generate at a predetermined time interval, for example, every second, digital data values, which have a time stamp based on the master clock time correlation information the time module 106 supplies to the controller 116 and are representative of the instantaneous (i) amount of AC energy which has been consumed by the facility; and (ii) rate of energy consumption by the facility. Also, the odometer 100 may be coupled to the import line, and generate at a predetermined time interval, for example, every second, digital data values, which also have a corresponding time reference based on the master clock time correlation information the time module 106 supplies to the controller 116 and are representative of the instantaneous (i) amount of AC energy which has been imported to the facility; and (ii) rate of energy importation to the facility. Further, the odometer 102 may be coupled to the export line, and generate at a predetermined time interval, for example, every second, digital data values, which similarly have a time stamp based on the master clock time correlation information the time module 106 supplies to the controller 116 and are representative of the instantaneous (i) amount of AC energy which has been exported from the facility; and (ii) rate of renewable energy exportation from the facility.

In a further embodiment, the collector 140 may be coupled to a thermometer outside of the facility, thermometers on respective solar panels of the solar panel array, a solar radiation detector on the roof of the facility, a wind speed and direction detector on the roof of the facility and also an operations mode sensor of an exhaust fan on the roof. Further in block 202, the collector 140 may generate at a predetermined time interval, for example, every second, from the sensor data supplied by the detectors or devices to which the collector 140 is coupled, digital data values, which have a time stamp based on the master clock time correlation information the time module 146 supplies to the controller 154 and are representative of the outside temperature, the temperatures of the respective solar panels, the solar radiation intensity, the wind speed and direction and the position of the damper and rotation speed of the fan of the exhaust fan.

In still a further embodiment, the collector 142 may be coupled to a thermostat in a room of the facility, a thermostat of a hot water heater for the facility, a thermostat of an HVAC system for the facility and also an operations mode sensor of a ventilator unit within a room of the facility. Further in block 202, the collector 142 may generate at a predetermined time interval, for example, every second, from sensor data available at the thermostats to which the collector 142 is coupled, digital data values, which have a corresponding time reference based on the master clock time correlation information the time module 146 supplies to the controller 154 and are representative of the temperature of the room, the temperature of the hot water in the hot water heater, the temperature of the air supplied from the HVAC system in the facility and whether the ventilator in the room is on or off.

In block 204, the request module 170, based on time correlation information of the master clock in the time module 174, may transmit interrogation request signals to the interrogator modules 54, 108 and 148 in the meters 12, 14 and the monitor 16, respectively. The request signals may include time of request information referenced to the master clock in the module 174. Based on the request signals, the modules 54, 108 may retrieve, and transmit to the controller 180, energy information from the odometers in the respective meters 12, 14 which correspond to energy measurements performed at the odometers 50, 100, 102, 104 at substantially the same time as the request time in the request signal. In addition, based on the request signal, the module 148 may retrieve, and transmit to the controller 180, environmental conditions and facility operations information from the collectors 140 and 142 which correspond to environmental conditions and facility operations monitoring performed at substantially the same time as the request time in the request signal. As the master clock in the module 174 is time correlated, and preferably time synchronized, with the master clocks at the respective modules 52, 106 and 146, the environmental conditions and facility operations information retrieved from the monitor 16 is time correlated or synchronized to the energy measurement information retrieved from the meters 12, 14. For example, the server 18 may request from the meters 12, 14 information representative of the amount of renewable energy generated for, energy imported to, energy exported from, and energy consumed at, the facility, since the beginning of the year 2008 and as of 7:00:00 a.m. on Jan. 10, 2008. The modules 54, 108, in turn, may retrieve the requested energy information from the meters 50, 100, 102, 104 having the time stamp of 7:00:00 a.m. on Jan. 10, 2008.

In one embodiment, accurate and reliable time correlation of the meters 12 and 14 advantageously provides that the individual energy odometers, such as the odometer 50, may be correctly read and manipulated, as needed. For example, if a resettable odometer 50 supplied a cumulative energy measurement data every hour, the energy measurement data for a particular hour may be lost if the time clock for the odometer 50 differs by one or two seconds from the time clock used to retrieve the energy measurement data.

In one embodiment, the collection of the requested information at the server 18 from the meters 12, 14 is performed in substantially real time.

In another embodiment, the server 18 may continuously collect energy information and environmental conditions and facility operation information from the meters 12, 14 and the monitor 16, respectively, at five second intervals based on the time correlation information of the master clock in the module 174.

In block 208, the controller 180 may store in the memory 178 the energy information and environmental conditions and facility operations information received from the meters 12, 14 and the monitor 16, respectively, based on the requests of block 204. In addition, the controller 180 may process the received energy and environmental condition and facility operation information, which constitute raw data, to obtain standardized, dimensionless data values for each of the measured information, such that the information measured from different sources can be readily processed using respective standardized values. For example, conventional techniques for mapping raw data to a normalized absolute value between zero and ten may be used. In one embodiment, the data value corresponding to the rate of renewable energy generation at a specific time may be mapped to an absolute normalized value between zero and ten, where ten is the maximum rate of renewable energy generation for the facility based on the capacity of the solar panel array and an absolute normalized value for the solar intensity measured at the specific time. In a further embodiment, the data value corresponding to the measured solar intensity may be mapped to an absolute normalized value which is a function of the maximum solar intensity that can impinge on the solar panel array positioned on the roof of the facility. Further in block 208, the controller 180 may store the standardized values for the received information in the memory 178.

In block 210, the controller 180 may determine energy performance results for the facility, based on the raw data or standardized data values for the collected energy and environmental conditions and operations condition information stored in the memory 178. In one embodiment, the controller 180, based on the raw data representative of the collected energy information, may determine how much renewable energy is being generated and also exported every five seconds, and how much energy is being consumed at the facility every five seconds.

In another embodiment, the controller 180 may store selected energy performance results in the memory 178 to provide that such results may be retrieved, in substantially real time, for display on a monitor, as discussed below in connection with block 212.

In block 212, the output module 172 may determine performance indicators for the facility, based on the energy performance results determined in block 210, and perform processing that generates inferences based on the energy performance results and also the collected energy and environmental conditions and operations information.

Figure 7:
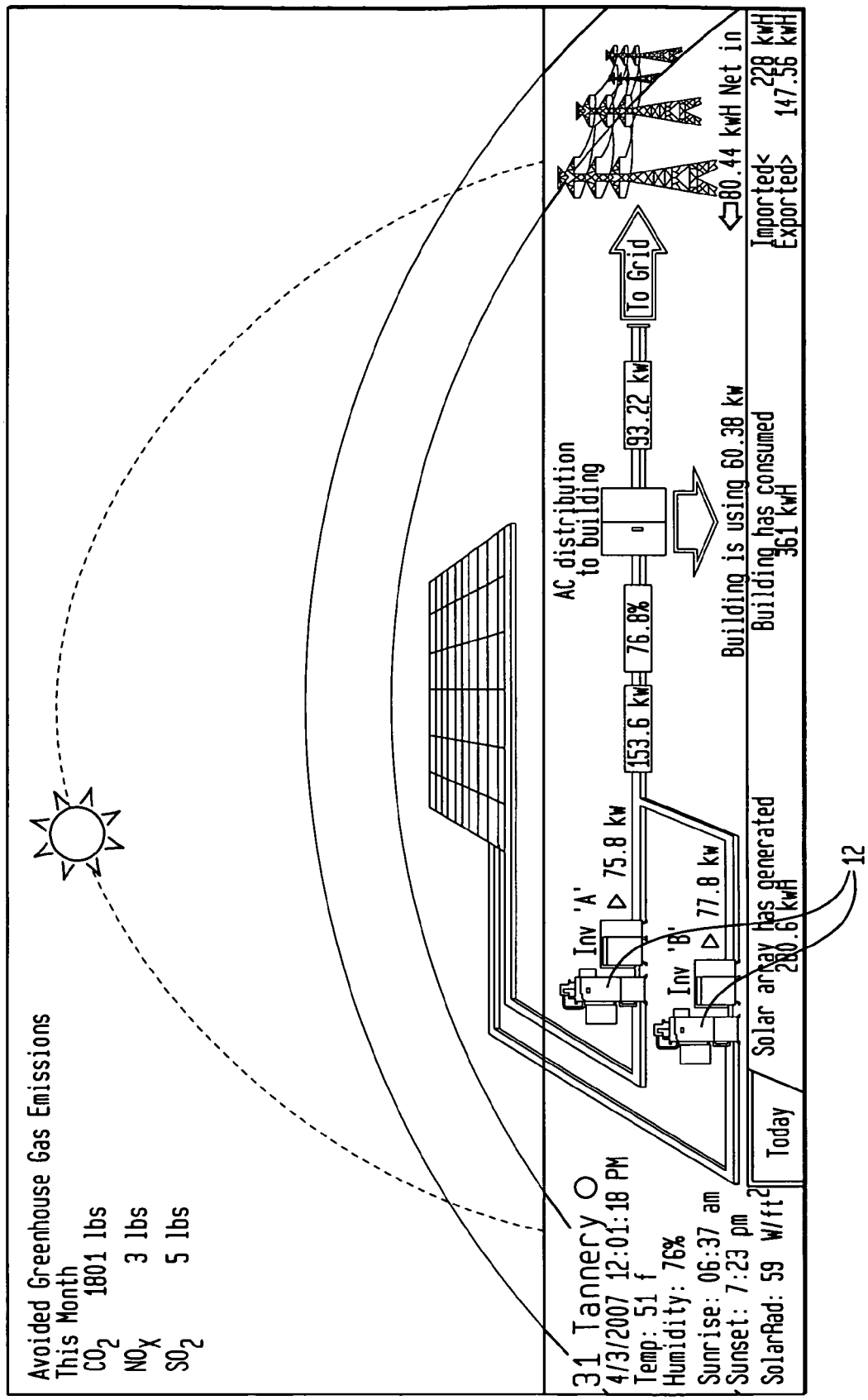
FIG. 7 is an illustration of an exemplary display in accordance with an aspect of the present invention.

In one embodiment, the module 172 may determine, from the energy performance results, whether renewable energy is being exported from the facility and provide for display of an indicator arrow whose color and direction depends on whether renewable energy is being exported or utility energy is being imported. Referring to FIG. 7, which is an exemplary display of renewable generation, and export, import and consumption of energy for a facility, the indicators may include an arrow at the bottom right of the display that is colored green and points toward a power line grid when renewable energy is being generated and exported to the grid; and arrows following the meters 12, which measure renewable energy generation at different portions of the solar panel array, where the arrows are colored green and point toward the facility when renewable energy is being generated from both of the solar array portions. Still referring to FIG. 7, indicators may include arrows and numerical values representative of the amount of energy consumed, for example, for the current day, and the instantaneous rate of energy consumption at the facility.

In another embodiment, the output module 172, based on the environmental conditions information concerning solar radiation intensity, which has been time stamped based on the time correlation information of the time module 146, may determine feedback information corresponding to the position of the sun in relation to the facility and the renewable energy generator (solar panel) on the roof of the facility. Based on such determination, referring to FIG. 7, the relationship between energy generation in the facility and the position of the sun may be illustrated by indicating the position of the sun on the display, where the position of the sun in the sky is indicated on the display in accordance with the time of day, and optionally the season and the latitude of the facility.

In a further embodiment, the output module 172 may provide for graphical display, in substantially real time, of the efficiency of portions of the solar panel, or individual solar panels, i.e., string-level monitoring of solar panels, where the renewable energy generation information for each solar panel portion or individual solar panels is included in the collected energy information. For example, the display of the efficiencies of respective panels of a solar panel array, or of multiple solar panel arrays, may show that the solar energy output for a particular solar panel array is one-half of an expected value, based on a comparison with energy output of other panels of the same solar panel array. From the displayed information, a determination may be made whether an inverter associated with the particular solar panel array is defective, for example, the inverter for the array was cycling too quickly between on and off within an hour.

In still another embodiment, the output module 172 may determine demand response information for routing to an angle control mechanism of a solar panel, based on the collected solar radiation intensity information and, in addition, information representative of the orientation of individual solar panels of the solar panel array on the roof which the collector 140 may collect as facility operations information. The demand response information, for example, may cause the angle control mechanism of the solar panel to modify the orientation of the panel in relation to the position of the sun during the course of a day, and also optionally based on other environmental conditions, such as cloud cover over the facility.

In a further embodiment, the output module 172 may generate demand response information, based on the energy performance results and the collected energy and environmental conditions and facility operations information, for automatically causing shutdown of or adjusting the thermostat of the hot water heater of the facility based, for example, on the time of day, whether renewable energy is being exported from the facility and the temperature of the hot water in the heater. For example, the demand response information may be used to cause shutdown of the hot water heater in the afternoon hours of summer months, when the temperature outside of the facility exceeds a predetermined level or renewable energy is not being exported from the facility.

In another embodiment, the determination of the energy performance results in block 210, and the display of a performance indicator on a display, such as a browser of a computer communicatively coupled to the server 18 over the Internet 20, may be performed in substantially real time.

In a further embodiment, the output module 172 may transmit data representative of the renewable energy generation history of the facility and renewable energy export from the facility to, for example, a conventional electrical energy utility, for a preceding time interval. The conventional utility, in turn, may use the historical and current renewable energy generation information for the facility for emergency management purposes, such as providing for use of the renewable energy generated for the facility in the event of a failure in the power grid.

In a still another embodiment, the output module 172 may transmit to a renewable energy exchange market, in substantially real time, verifiable information of renewable energy generation at the facility, and also energy performance results representative of carbon footprint reduction for the facility, based on verifiable information of current and historical generation of renewable energy at the facility.

In a further embodiment, the output module 172 may transmit control signals for switching energy consumption devices in a facility on and off, based on energy performance results representative of how much energy was imported to the facility over a predetermined time period, such that energy budget goals for limiting the usage of imported energy at the facility, which rely upon the consumption of renewable energy instead of imported energy at the facility, may be satisfied.

In another embodiment, the controller 180 may store in the memory 178 selected energy performance results and also performance indicators, which are generated by the output module 172, to provide that that the server 18 may respond to a request for a performance indicator, such as from a remote communications device communicatively coupled to the server 18 over the communications network 20, in substantially real time, and provide for display of such indicators on a monitor coupled to the communications device, also in substantially real time.

In another aspect of the present invention, monitoring and management of energy performance of a facility may be performed where the facility does not include a renewable energy generator. In one embodiment of this aspect of the invention, the system 10, which may be modified by omitting the meter 12 and the odometers 100, 102 of the meter 14, may be used for monitoring and management of energy performance of the facility, and the process 200 may be used to determine energy performance results and performance indicators, with the exception that information representative of the generation and exportation of renewable energy, which is not collected by the system 10, is not used in the determination of energy performance results and performance indicators.

In one embodiment, the output module 172, based on the energy consumption information for the facility, and also energy budget information for the facility which may be stored in the memory 178, may determine a performance indicator for display on a monitor that shows a comparison between actual and budgeted energy consumption at the facility in terms of cost and also energy units, such as KwH.

In a further embodiment, the collector 142 may be coupled to a fossil fuel meter, such an oil, utility electricity or utility natural gas meter; a renewable energy meter, such as a solar, geothermal, biomass, hydrogen-based, etc. energy meter; or a water meter, for a facility, such that data representative of energy or water usage at the facility may be monitored by the system 10 and used by output module 172 for determining energy performance results and performance indicators.

In a further embodiment, the output module 172, based on historical energy usage information for the facility preceding the implementation of energy consumption savings features at the facility which may be stored in the memory 178, may provide for a display, such as illustrated in the exemplary screen display of FIG. 8, comparing, for a predetermined time period, energy consumption at the facility preceding the implementation of the energy savings feature, budgeted energy consumption for the facility following the implementation of the energy savings feature and energy consumption energy at the facility following the implementation of the energy savings feature, where the energy units are KwH or BTUs.

In another embodiment, the output module 172, based on the operations information obtained by monitoring a thermostat of a room and an on/off switch of a ventilator for the room in a facility, may generate a demand response signal for alerting an operator of the facility that the ventilator requires servicing, for example, the damper door is broken or set to the incorrect position.

In a further embodiment, the collector 142 may be coupled to the utility electricity meter within a facility, such that data representative of electricity usage at the facility, as determined at the utility meter, may be collected by the system 10. In such embodiment, the output module 172, based on the consumption energy information measured at the odometer 104 and the monitored utility meter energy usage information, may determine whether charges on a bill from the utility are the same as a determination of energy consumption by the facility represented in energy performance results determined by the module 172.

In another alternative embodiment, the output module 172, based on the consumption energy information measured at the odometer 104, may determine a performance indicator that verifies whether the facility satisfies energy savings standards set forth, for example, in a building contract or governmental regulations.

In still another embodiment, the output module 172, based on the energy export and import information measured at the meter 14, may determine a performance indicator representative of instantaneous or cumulative over time energy consumption equivalence in terms of fossil fuel usage, import of fossil fuel from a specified source, global warming, carbon footprint, effect of energy efficient ("EE") or renewable energy ("RE") programs or measures, solar PV and thermal system efficiency of sunlight to Kwh or BTUs, etc. In a further embodiment, the performance indicator may be representative of Energy Star compliance, Leadership in Energy and Environmental Design ("LEED") tracking credits, compliance with state and federal energy codes and standards, conservation credits and the like. In another embodiment, the output module 172 may transmit, in substantially real time, performance indicators representative of energy, greenhouse gas and carbon credits to an energy and greenhouse gas credit and usage trading exchange.

In another aspect of the invention, systems 10 may be coupled to respective facilities of a campus or enterprise, or various mechanical, electrical and plumbing systems and sub-systems, and the information monitored by the systems 10 may be processed, similarly as in the process 200, for determining energy performance and performance indicators for the plurality of the facilities, at selected facilities, at selected portions of a facility, such as of a room or floor of a selected facility, and at selected systems and sub-systems. In one embodiment, the performance indicators may include comfort performance indicators ("CPI"), operations and maintenance performance indicators ("OPI"), monetary performance indicators ("MPI") and custom user-defined performance indicators. Such indicators may be combined to create any type of facility performance indicator ("FPI") and also to indicate performance of multiple facilities, such as campus-wide performance over any time period, such as daily, weekly, monthly, quarterly, yearly, seasonal, etc.

Exemplary CPIs may include temperature, humidity, light level, sound, air quality and thermostat setpoint movement by occupants of a facility as an indication of discomfort. Exemplary OPIs may include percentage of facility systems operational, on or off; percentage of filters clean or dirty in an HVAC system; actual performance and control of HVAC system versus setpoint; heating plant performance; cooling plant performance; verification of air and water side economizer cycles; and real time verification of equipment performance in relation to manufacturer specifications. OPIs may be used to indicate the operations and maintenance needs of various types of systems in a facility including air handling units; rooftop units; pumps; boilers; chillers; exhaust fans; renewable energy systems, such as solar, wind, geothermal, etc.; and energy recovery units.

In another embodiment, the output module 172 may provide performance indicators for use in managing service level agreements or regulating lease agreements for a facility, where the indicators may include a determination of Energy Star, LEED or other forms of facility operation, energy efficiency and renewable energy system performance goal and target compliance. For example, an agreement may require that a particular indicator, which the system 10 may determine from the monitored energy information, needs to be maintained at or near 70%, that a penalty is assessed if the indicator falls below 50% and that an award is received if the indicator rises above 90%.

In a further embodiment, the output module 172 may determine, from the collected information and the energy performance results, a composite FPI, which is a combination of several performance indicators. In an exemplary implementation, as shown in FIG. 9A, the output module 172 may combine a comfort PI and an energy PI to form an FPI which includes both comfort and energy considerations combined in a way that a user finds meaningful and desirable. In one embodiment, the component PIs may be weighted or mathematically operated upon in any desired fashion to yield a FPI.

For example, a composite FPI may provide, in substantially real time, information on the energy performance of a building that, in the prior art, would have required an experienced and trained individual, such as an engineer, facility manager, service technician, architect, etc., to walk around the building or spend hours on a energy management system to obtain the same information. The FPI is automatically provided in substantially real time, and thus before the conditions of the facility have changed information, and is based upon data measurements that are unaffected by human bias, such that the same type of data measurements are always used to determine energy performance results. Further, the FPI can be tracked like any other "sensor", such that when the FPI is viewed together along with the energy meters (renewable and fossil) for a building and also the carbon and energy footprint, instant feedback is available concerning the results of any energy efficiency and/or renewable energy projects or programs, to provide a real perspective for action.

Figure 9B:
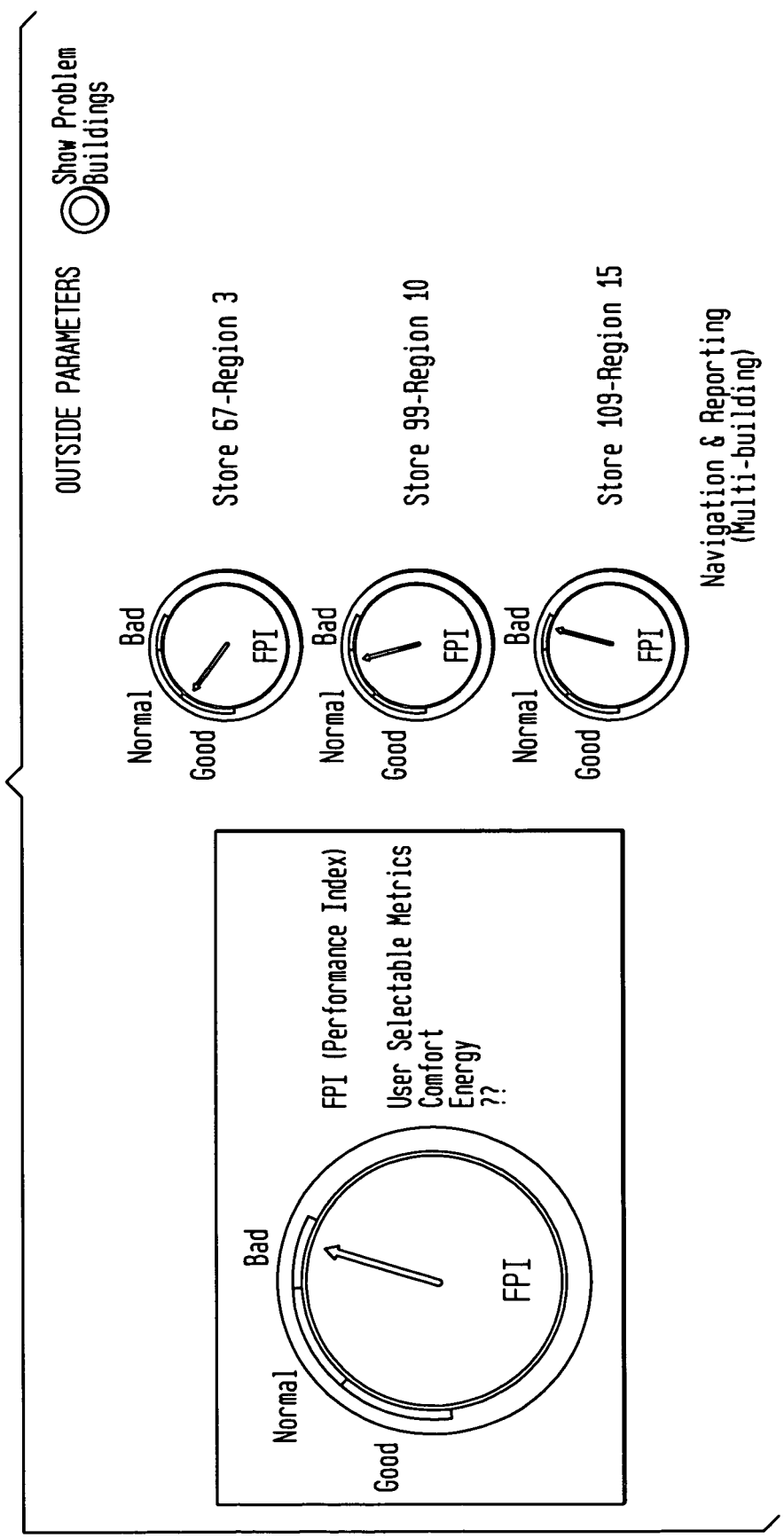

In an exemplary embodiment as shown in FIG. 9B, the output module 172 may determine an FPI that combines PIs from several different facilities. Referring to FIG. 9B, PIs from three stores of an enterprise in three different regions may be combined in any desired way to form a single FPI. In this way, overall performance may be seen at a glance.

In another embodiment, the output module 172 may group performance indicators on a display, as shown in FIG. 9C, to provide that energy performance results may be grasped at a glance and used immediately for decision making, such as for making operational adjustments. Referring to FIG. 10, the display may include a group of metrics indicators, which are combined to form PIs, which are further combined to form an FPI. As will be appreciated, using such a display, a user with very little effort can understand a wealth of information. Information regarding a plurality of devices, systems and combinations may easily be grasped. The information may convey information pertaining to any or all of occupant comfort, operations and maintenance, energy usage, monetary indicators and other predefined and user defined indicators. The information may comprise information over different scales in the same view, and include FPIs regarding a particular facility, complex, region, state, enterprise or other grouping, such as various functional groupings. A user may thereby instantly see what would require a trained person much time to interpret or infer.

In still another embodiment, the output module 172 may provide for display of performance indicators, as shown in FIG. 9D, where energy and facility operations information is grouped simultaneously by function on the bottom left quadrant of the display, and by facility on the right side of the display. Referring to FIG. 9D, the output module 172 may provide that higher level PIs are at the top left quadrant of the display. In a further embodiment, the PIs may be calculated, weighted, grouped and displayed in any desired way, such as in accordance with user definitions. In this way, a user can quickly and easily gain a perspective based on precisely the information and calculations the user finds meaningful.

Thus, the present invention advantageously provides technology for coordinating a large number of variables associated with energy management, in a manner that provides an energy flow understanding translatable into controlling the variables, such as thermostat settings and internal energy use, and for adapting to variables beyond the control of energy managers, such as seasonality. Further, the invention permits real time adjustments by an energy management system, such that overall import of energy from the energy grid may be reduced or minimized, and export of energy created by a facility, such as from solar radiation, may be increased or maximized. Ideally, by using the inventive technology, energy input and output may be optimized, such that the energy profile of a facility over the course of a year may reflect minimal consumption and, most ideally, actually provides a net energy yield through energy output to the energy grid.

Further, the ability to provide real time management of energy input and output for a facility provides the following additional benefits. For example, the ability of energy facility managers to understand actual, real time data and provide that information to facility users inevitably can enhance energy efficiency within the facility. When facility users can visualize energy consumption, the users can become aware of personal habits that, when combined with habits of others in a facility, may cause significant increases in energy input to the facility. This awareness would likely encourage users to engage in habits more likely to conserve energy, such as the shutting down of computer terminals when a person leaves the facility at the end of the day.

Another example with far reaching consequence, which may be achieved by using the inventive technology, is the ability to quantify, in real time, the amount of energy saved by proper facility energy management. This quantification is especially noteworthy in connection with the renewable energy generated at a facility and exported into the energy grid for use by others. Such energy optimization can result in a so-called "net zero" energy building where, over the course of a year, a building actually exports more energy to the energy grid than the facility imports from the energy grid. One particular application of this advance is the ability to quantify the energy credits a facility obtains by exporting energy to the energy grid as opposed to importing energy from the energy grid. The ability to track energy import and export on a real time basis permits direct quantitative crediting of exported energy, as may be expressed by energy credits to a facility, for example, in the form of energy trading units. These energy trading units may thus be directly accounted for by energy markets and used, in effect, as energy currency. The energy currency can be traded to facility owners, facility energy providers and by commodities markets in a far superior manner than is presently available, because, at present, such energy trading units are only approximated by virtue of statistics and formula, and are not accounted for on a real time basis.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A system for managing energy performance comprising:
a renewable energy meter for coupling to an output of a renewable energy generator of a facility, wherein the renewable energy meter is for monitoring generation of renewable energy by the renewable energy generator and for supplying, in real time, renewable energy data representative of the generation of renewable energy, wherein the renewable meter includes a first communications module;
a facility energy meter for coupling to an export energy conveying medium, an import energy conveying medium and a consumption energy conveying medium, wherein the facility energy meter is for monitoring (i) export of the renewable energy generated by the renewable energy generator from the facility on the export medium; (ii) import of energy to the facility on the import medium; and (iii) energy conveyed on the consumption medium for consumption at the facility;
wherein the facility energy meter is for supplying, in real time, (i) exported energy data representative of the energy exported from the facility; (ii) imported energy data representative of the energy imported to the facility; and (iii) consumed energy data representative of the energy consumed at the facility, wherein the facility meter includes a second communications module;
an energy management module for communicatively coupling to the first and second communications modules and for obtaining, in real time, the renewable energy data from the renewable energy meter and the imported, exported and consumed energy data from the facility energy meter, wherein the management module, in real time, processes the obtained energy data for determining energy performance data for the facility, wherein the energy performance data indicates whether at least a portion of the renewable energy generated by the renewable energy meter is being exported from the facility; and
wherein the management module, in real time, controls display on a display screen of indicia indicating renewable energy is being exported from the facility when the energy performance data indicates that at least a portion of the renewable energy generated by the renewable energy meter is being exported from the facility.

2. The system of claim 1, wherein the management module, in real time, transmits display data indicating the indicia over a communications network in response to a request for the display data.

3. The system of claim 1, wherein the renewable energy data, the exported energy data, the imported energy data and the consumed energy data are time correlated.

4. The system of claim 3, wherein the management module transmits, to at least one of the renewable meter and the facility meter, a request for transmission from the at least one meter to the management module of the supplied energy data for a predetermined time.

5. The system of claim 2, wherein the management module controls display of indicia representative of whether energy is being exported from, or imported to, the facility at a predetermined time.

6. The system of claim 2, wherein the management module controls display of at least one of an instantaneous renewable energy generation value, an instantaneous imported energy value, an instantaneous exported energy value and an instantaneous consumed energy value.

7. The system of claim 1 further comprising:
an environmental conditions monitor for monitoring, in real time, at least one of an environmental condition in an interior of the facility and an environmental condition exterior to the facility, wherein the environmental monitor is for supplying, in real time, environmental conditions data representative of the monitored environmental conditions, and wherein the environmental monitor includes a third communications module; and
wherein the management module is for communicatively coupling to the third communications module and for obtaining, in real time, the environmental conditions data from the environmental monitor.

8. The system of claim 7, wherein the renewable energy data, the exported energy data, the imported energy data, the consumed energy data and the environmental conditions data are time correlated, wherein the management module is for communicatively coupling to at least one of the renewable energy generator and an energy consumption device in the facility, wherein the management module, in real time, generates and transmits to an operations control module, coupled to at least one of the energy generator and the energy consumption device, demand response data determined based on the energy performance data.

9. The system of claim 1, wherein the management module controls display of a performance indicator on the display screen.

10. The system of claim 1 further comprising:
an operations monitor for monitoring, in real time, at least one of an operations condition in an interior of the facility and an operations condition exterior to the facility, wherein the operations monitor is for supplying, in real time, operations data representative of the monitored operations conditions, and wherein the operations monitor includes a third communications module; and
wherein the management module is for communicatively coupling to the third communications module and for obtaining, in real time, the operations condition data from the operations monitor.

11. The system of claim 7 further comprising:
an operations monitor for monitoring, in real time, at least one of an operations condition in an interior of the facility and an operations condition exterior to the facility, wherein the operations monitor is for supplying, in real time, operations data representative of the monitored operations conditions, and wherein the operations monitor includes a fourth communications module; and
wherein the management module is for communicatively coupling to the fourth communications module and for obtaining, in real time, the operations conditions data from the operations monitor.

12. The system of claim 11, wherein the renewable energy data, the exported energy data, the imported energy data, the consumed energy data, the environmental conditions data and the operations data are time correlated, wherein the management module is for communicatively coupling to a regulator of an operations device in the facility monitored by the operations monitor and for supplying to the regulator, in real time, demand response data determined based on the energy performance data.

13. The system of claim 12, wherein the demand response data includes data for controlling an operational component of the device.

14. The system of claim 1, wherein the renewable energy generator includes at least one of a solar panel and wind turbine.

15. The system of claim 1, where the facility includes a plurality of facilities.

16. A system for certifying energy performance comprising:
- a renewable energy meter having communications capabilities and for coupling to an output of a renewable energy generator of a facility, wherein the renewable energy meter is for monitoring generation of renewable energy by the renewable energy generator and for supplying, in real time, renewable energy data representative of the generation of renewable energy;
- a facility energy meter having communication capabilities and for coupling to an export energy conveying medium, an import energy conveying medium and a consumption energy conveying medium, wherein the facility energy meter is for monitoring (i) export of the renewable energy generated by the renewable energy generator from the facility on the export medium; (ii) import of energy to the facility on the import medium; and (iii) energy conveyed on the consumption medium for consumption at the facility;
- wherein the facility energy meter is for supplying, in real time, (i) exported energy data representative of the energy exported from the facility; (ii) imported energy data representative of the energy imported to the facility; and (iii) consumed energy data representative of the energy consumed at the facility;
- an energy management module for communicatively coupling to the renewable energy meter and the facility energy meter and for obtaining, in real time, the renewable energy data from the renewable energy meter and the imported, exported and consumed energy data from the facility energy meter, wherein the management module, in real time, processes the obtained energy data for determining certified energy performance data for the facility,
- wherein the management module, in real time, controls, based on the certified performance data, display on a display screen of an indication of (i) a difference between expected and actual renewable energy generated by the renewable energy generator for the facility; (ii) a difference between expected and actual consumption of energy at the facility; and (iii) a difference between expected and actual imported energy at the facility, wherein the performance data is for a predetermined time interval.

17. The system of claim 16, wherein the renewable energy data, the exported energy data, the imported energy data and the consumed energy data are time correlated.

18. The system of claim 16, wherein the management module, in real time, transmits the certified data to a remote communications device.

19. A method for diagnosing energy performance operation for a facility comprising:
- monitoring generation of renewable energy by a renewable energy generator of the facility and supplying, in real time, energy data representative of the monitored, generated renewable energy; and
- monitoring operation conditions of and environmental conditions at the renewable energy generator and supplying, in real time, monitoring data representative of the monitored operation and environmental conditions, the monitoring data being time correlated with the energy data;
- communicating the supplied energy and monitoring data, in real time, to a data processing device, wherein the processing device, in real time, determines energy performance results for the renewable energy generator, based on the energy data, the monitoring data and data representative of expected energy performance operation of the renewable energy generator; and
- providing, by a processor, for adaptive control of the renewable energy generator of the facility, in real time, based on the energy performance results, to modify generation of renewable energy by the renewable energy generator.

* * * * *